United States Patent
Tsunoda

(10) Patent No.: US 6,675,346 B2
(45) Date of Patent: Jan. 6, 2004

(54) CODE TRANSMISSION SCHEME FOR COMMUNICATION SYSTEM USING ERROR CORRECTING CODES

(75) Inventor: Keiji Tsunoda, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/230,991

(22) Filed: Aug. 30, 2002

(65) Prior Publication Data

US 2003/0005387 A1 Jan. 2, 2003

Related U.S. Application Data

(63) Continuation of application No. 09/089,450, filed on Jun. 3, 1998.

(30) Foreign Application Priority Data

Jun. 4, 1997 (JP) .............................. 9-146934
Aug. 29, 1997 (JP) .............................. 9-233170

(51) Int. Cl.⁷ .............................................. H03M 13/00
(52) U.S. Cl. ....................................... 714/774; 714/785
(58) Field of Search ................................ 714/785, 781, 714/774

(56) References Cited

U.S. PATENT DOCUMENTS

| | | | |
|---|---|---|---|
| 4,191,970 A | * | 3/1980 | Witsenhausen et al. .. 348/420.1 |
| 4,455,655 A | | 6/1984 | Galen et al. |
| 4,597,083 A | * | 6/1986 | Stenerson .................. 714/753 |
| 5,313,624 A | | 5/1994 | Harriman et al. |
| 5,581,566 A | | 12/1996 | St. John et al. |
| 5,598,422 A | | 1/1997 | Longwell et al. |
| 5,898,708 A | | 4/1999 | Tateishi et al. |
| 6,021,433 A | * | 2/2000 | Payne et al. ................ 709/219 |
| 6,128,528 A | | 10/2000 | Ericksen et al. |

FOREIGN PATENT DOCUMENTS

WO    WO 91/17503 A1    11/1991

OTHER PUBLICATIONS

Stephen B. Wicker, "Error Control Systems for Digital Communication and Storage", Prentice–Hall, 1995.*
Tsunoda et al., "An investigation of cell–level FEC for wireless ATM," 1996, 1 Sheet.
Tsunoda et al., "An investigation of the error control for ATM cells in wireless environment." 1996, 1 Sheet.

(List continued on next page.)

Primary Examiner—Albert Decady
Assistant Examiner—Joseph D. Torres
(74) Attorney, Agent, or Firm—Foley & Lardner

(57) ABSTRACT

In a code transmission scheme for a communication system using error correcting codes, the transmitting side generates at least one transmitting side syndrome value by carrying out a syndrome calculation for the information to be transmitted, and transmits to a receiving side at least one information packet containing the information to be transmitted and at least one redundant packet containing the transmitting side syndrome value. Then, upon receiving at least a part of the information packet and the redundant packet, the receiving side obtains at least one receiving side syndrome value by carrying out a syndrome calculation for an information contained in the information packet as received, and performs error correction, if required, by calculating a difference between the transmitting side syndrome value contained in the received redundant packet and the receiving side syndrome value, so that a circuit size and an amount of software programs can be reduced without affecting the error correction performance.

20 Claims, 18 Drawing Sheets

OTHER PUBLICATIONS

Kanai et al., "Forward Error Correction Control on AAL 5: FEC–SSCS," 1996, IEEE, pp. 384–391.

Kanai et al., "Error Control Protocols on AALS: FEC-SSCS," 1995, 1 Sheet.

Kanai et al, "Error Control Protocols on AALS and Evaluation: FEC–SSCS," The Institute of Electronics, Information and Communication Engineers, Technical Report of IEICE, 1995, pp. 1–6.

McAuley, "Reliable Broadband Communication Using a Burst Erasure Correcting Code," ACM, 1990, pp. 297–306.

Carle, "Error Control for Reliable Multipoint Communication in ATM Networks," Proceedings of third International Conference on Computer Communications and Networks ICCN, Sep. 11–14, 1994, 3 Sheets.

Matsuzaki et al., "A Study of Error Correction Method with the Alignment Between ATM Cell and MPEG–2 Transport Packet," 1994, 1 Sheet.

"Integrated Services Digital Network (ISDN) Overall Network Aspects and Functions," International Telecommunications Union, Mar. 1993, Telecommunication Standardization Sector of ITU, 10 Sheets.

Esaki et al., "Evaluation of High Speed Multimedia Communication Architecture in ATM Networks," IEICE Trans. Comm., vol. E77–B, No. 11, Nov. 1994, pp. 1407–1419.

Yamazaki "Integrated Report on AAL1&2 (AAL Types 1 and 2) For Video Signal Transport," ITU–T, Mar. 7–18, 1994, 4 Sheets.

* cited by examiner

CODE TRANSMISSION SCHEME FOR COMMUNICATION SYSTEM USING ERROR CORRECTING CODES

RELATED APPLICATIONS

This application claims priority to U.S. patent application Ser. No. 09/089,450, filed Jun. 3, 1998.

BACKGROUND OF THE INVENTION

1. Field of the Invention

The present invention relates to a code transmission scheme to be used for the purpose of realizing reliable end-to-end communications between networks, especially computers.

2. Description of the Background Art

The computer communication conventionally adopts a scheme in which data are sequentially transferred between small sized networks called subnets via devices such as bridges and routers. Here, a data unit for transfer is called an IP (Internet Protocol) packet.

The IP packet transfer has been realized on the best effort basis historically, where it is assumed that data can be discarded or lost at network devices such as switches and routers provided within the network. Then, when an IP packet transmitted from a transmitting side fails to reach a receiving side, in general, either an end-to-end re-transmission has been carried out (by TCP (Transmission Control Protocol), for example), or no action has been taken (by UDP (User Datagram Protocol), for example) even if this communication fails.

Also, conventionally, communications using computers have been predominantly of point-to-point type. However, recently, there is an increasing need for communications using multicast. Conventionally, in the case of realizing multicast, it has been common to adopt a scheme in which UDP and the like is used as the upper level protocol and no request for high quality is allowed. The reason for this is that, if the end-to-end re-transmission control is carried out by utilizing the multicast, a number of ACK (Acknowledgement)/NACK (Negative Acknowledgement) signals for indicating whether the receiving has been successful or not from the receiving side increases in proportion to a number of receiving terminals, so that the processing load at a transmitting terminal can be increased.

In view of such a background, there have been propositions for a scheme using end-to-end error correction as a scheme for realizing both a multicast system and reliable communications.

As a first example, a communication scheme that secures the end-to-end reliability by adding error correction cells using Reed-Solomon (RS) codes to a plurality of ATM cells has been disclosed in Japanese Patent Application Laid Open No. 8-186570 (1996). According to this scheme, the usual Reed-Solomon code is separated into the information section used as ATM cells for data and the redundant section used as ATM cells for codes, so that when m cells for data and one cell for codes are provided, it is possible to recover discarded cells up to one cell among (m+1) cells using the error correction. By such an application of the error correcting codes, it is possible to realize high quality end-to-end communications.

However, this scheme is associated with the following problem. In general, it is preferable to be able to set the level of redundancy individually by a communication network. However, because the usual code words are used currently, it is necessary to carry out different coding calculating processing when the number of redundant cells to be attached is changed.

More specifically, the RS code has the redundant section which is a residue obtained by dividing the information section by a polynomial called G(X). For instance, in the case of using one cell redundancy, G(X) can be expressed as:

$$G(X) = X - \alpha^b \tag{1}$$

where $\alpha$ is a root of a primitive polynomial used as a base of this code production, and b is an integer whose value is predetermined between the transmitting side and the receiving side. In other words, G(X) must be shared at the transmitting side and the receiving side. However, in the cases of two cells redundancy and three cells redundancy, G(X) can be expressed respectively as:

$$G(X) = (X - \alpha^b)(X - \alpha^{(b+1)}) \tag{2}$$

$$G(X) = (X - \alpha^b)(X - \alpha^{(b+1)})(X - \alpha^{(b+2)}) \tag{3}$$

In these cases, the respective polynomials have different degrees so that it is necessary to carry out a division calculation separately for each of them. This implies in terms of the hardware implementation that there is a need to provide completely separate calculation circuit for each of them so that it can cause an increase in the circuit size. Also, in terms of the software program, this implies that a separate program must be produced for each of them, so that it can cause an increase in the amount of software programs.

Next, as a second example of a proposition for a scheme using end-to-end error correction, a scheme which is conceived as a technique for combining the error correction and the re-transmission will be described. This scheme is considered particularly effective in the case of multicast.

First, a sender sends m information packets and l redundant packets that are associated with these information packets to a receiver, where l is a 0 or a positive integer. When the receiver detects that l or less packets among (m+l) packets fails to arrive, the correction using the redundant packets is carried out. However, when discarding of l' packets (l'>l) occurs in the middle, the receiver requests the re-transmission of (l'-l) packets to the sender. In response, the sender newly produces (l'-l) redundant packets and sends them to the receiver. As a result, the receiver obtains l' redundant packets so that it becomes possible to recover the original information packets by carrying out the error correction with respect to discarding of l' packets.

In this scheme, the sender is initially capable of producing l redundant packets using the method as explained in the first example, but there is a problem as to how (l'-l) redundant packets are to be produced subsequently. For instance, suppose that the transmission using two packets redundancy with l=2 is carried out initially as in the first example, using G(X) given by:

$$G(X) = (X - \alpha^b)(X - \alpha^{(b+1)}) \tag{4}$$

and suppose that four packets fail to arrive at the receiving side due to discarding. In such a case, the re-transmission request for remaining two packets will be issued from the receiving side to the transmitting side. In response, the transmitting side is required to produce the redundant packets using, for example, a polynomial given by:

$$G'(X) = (X - \alpha^{(b+2)})(X - \alpha^{(b+3)}) \tag{5}$$

At this point, it is meaningless to use the equation (4) because that would result in the transmission of the same redundant packets, so that it is necessary to use the polynomial like that of the equation (5) which uses different powers of α. Consequently, there is a need to newly produce G'(X) according to the number of re-transmission packets requested from the receiving side, and therefore there are problems of an increase in the circuit size and an increase in the amount of software programs similarly as in the first example.

Thus, conventionally, the re-transmission control using a protocol such as TCP has been carried out for data that requires the reliability, but a scheme using the error correction for the purpose of dealing with multicast has appeared. However, in the conventional scheme that transmits the redundant section of the usual error correcting codes as it is, there is a problem that the number of redundant packets cannot be changed flexibly. In addition, even in the case of combining that with the re-transmission control, there is also a problem that the redundant packets cannot be provided flexibly at a time of re-transmission.

SUMMARY OF THE INVENTION

It is therefore an object of the present invention to provide a code transmission scheme for a communication system using error correcting codes, which is capable of reducing a circuit size and an amount of software programs without affecting the error correction performance.

It is another object of the present invention to provide a flexible error correction scheme according to a state of communication network.

It is another object of the present invention to provide an error correction scheme which can produce redundant packets easily even in the case of using the re-transmission in combination.

It is another object of the present invention to provide a reliable communication system realizing the multicast, using the error correction scheme of the present invention.

According to one aspect of the present invention there is provided a method for transmitting an error correcting code corresponding to an information to be transmitted in a communication system, comprising the steps of: generating at least one transmitting side syndrome value by carrying out a syndrome calculation for the information to be transmitted at a transmitting side; and transmitting, from the transmitting side to a receiving side, at least one information packet containing the information to be transmitted and at least one redundant packet containing the transmitting side syndrome value generated by the generating step as a redundant part of the error correcting code.

In this aspect of the present invention, the generating step can generate as many transmitting side syndrome values as a number corresponding to a desired error correction capability using said number of mutually different polynomials of degree one.

Conventionally, one redundant part is generated using a polynomial of degree corresponding to the desired error correction capability, but the present invention generates said number of redundant parts using said number of polynomials of degree one, so that when it is desired to increase the error correction capability, it suffices to simply increase the number of mutually different polynomials of degree one and repeat the coding calculation as many times as that number using the common calculation method or circuit configuration, rather than calculating the redundant part using the polynomial of increased degree (which makes the circuit larger and complicated as the different circuit configuration is required for the coding calculation when the degree is changed).

Also, in this aspect of the present invention, the method can further comprise the step of: transmitting another redundant packet containing another transmitting side syndrome value, as re-transmission from the transmitting side to the receiving side, when the receiving side cannot recover the information from the information packet and the redundant packet received by the receiving step.

In the case of re-transmission, it suffices to generate and transmit as many redundant parts as necessary for the recovery of the information (or more) using that many of the polynomials of degree one (which are different from those used at a time of initial transmission), so that the coding calculation can be carried out using the common calculation method or circuit configuration both at a time of initial transmission and at a time of re-transmission. Here, the number of redundant parts to be transmitted at a time of re-transmission may be the number requested from the receiving side. Alternatively, it is also possible to use a scheme in which the transmitting side transmits a prescribed number of redundant parts and each receiving side selectively receives as many as necessary or can be processed at each receiving side. Also, in the case of using multicast, even when the number of redundant parts necessary for the recovery of the information at some receiving side differs from the number of redundant parts necessary for the recovery of the information at another receiving side, there is no need to carry out totally different calculations (using polynomials of different degrees) with respect to these receiving sides as has been required conventionally, and it suffices to generate and transmit the largest number of redundant parts necessary such that some receiving side can recover the information using all of these redundant parts while another receiving side can recover the information using only part of these redundant parts. Here, it is also possible to send all of the plurality of generated redundant parts to some receiving side and only a part of the plurality of generated redundant parts to another receiving side.

Also, in this aspect of the present invention, the transmitting step can transmit the information packet and the redundant packet by multicast with respect to a plurality of receiving sides.

In the case of multicast, even when the error correction capability desired by some receiving side differs from the error correction capability desired by another receiving side, there is no need to carry out totally different calculations (using polynomials of different degrees) with respect to these receiving sides as has been required conventionally, and it suffices to generate some number of redundant parts of the error correcting code using the common calculation method or circuit configuration, transmit them to the receiving sides, and receive and use only as many redundant parts as necessary or can be processed at each receiving side.

According to another aspect of the present invention there is provided a method for transmitting an error correcting code corresponding to an information to be transmitted in a communication system, comprising the steps of: transmitting, from a transmitting side to a receiving side, packets generated by applying an error correction coding processing with respect to the information to be transmitted at the transmitting side; and generating at least one transmitting side syndrome value by carrying out a syndrome calculation for the information to be transmitted at the transmitting side, and transmitting, from the transmitting side to the receiving side, at least one redundant packet containing the transmitting side syndrome value as a redundant part of the error correcting code, when the receiving side cannot recover the information to be transmitted from the packets received from the transmitting side and requests a re-transmission.

It is possible to realize the significant effect by carrying out the transmission using arbitrary error correction coding scheme (which can be even the conventional coding scheme) at a time of transmitting the information first, and then carry out the transmission using the error correction coding scheme of the present invention when a re-transmission is requested. For example, in the case of multicast communication, even when the amount of information necessary for the recovery of the information at some receiving side differs from the amount of information necessary for the recovery of the information at another receiving side, there is no need to carry out totally different calculations (using polynomials of different degrees) with respect to these receiving sides as has been required conventionally, and it suffices to generate some number of redundant parts using the common calculation method or circuit configuration, and re-transmit them to the plurality of receiving sides, such that some receiving side can recover the information using all of these redundant parts while another receiving side can recover the information using only part of these redundant parts.

According to another aspect of the present invention there is provided a transmission device for transmitting an error correcting code corresponding to an information to be transmitted in a communication system, comprising: a generation unit for generating at least one transmitting side syndrome value by carrying out a syndrome calculation for the information to be transmitted at a transmitting side; and a transmission unit for transmitting, from the transmitting side to a receiving side, at least one information packet containing the information to be transmitted and at least one redundant packet containing the transmitting side syndrome value generated by the generation unit as a redundant part of the error correcting code.

According to another aspect of the present invention there is provided a reception device for receiving an error correcting code corresponding to an information to be transmitted in a communication system, comprising: a reception unit for receiving at least a part of at least one information packet containing the information to be transmitted and at least one redundant packet containing at least one transmitting side syndrome value for the information to be transmitted as calculated by a transmitting side; a calculation unit for obtaining at least one receiving side syndrome value by carrying out a syndrome calculation for an information contained in the information packet as received by the reception unit; and a correction unit for performing error correction, if required, by calculating a difference between the transmitting side syndrome value contained in the redundant packet as received by the reception unit and the receiving side syndrome value obtained by the calculation unit.

According to another aspect of the present invention there is provided a communication system for transmitting an error correcting code corresponding to an information to be transmitted, comprising: a generation unit for generating at least one transmitting side syndrome value by carrying out a syndrome calculation for the information to be transmitted at a transmitting side; a transmission unit for transmitting, from the transmitting side to a receiving side, at least one information packet containing the information to be transmitted and at least one redundant packet containing the transmitting side syndrome value generated by the generation unit as a redundant part of the error correcting code; a reception unit for receiving at least a part of the information packet and the redundant packet transmitted by the transmission unit; a calculation unit for obtaining at least one receiving side syndrome value by carrying out a syndrome calculation for an information contained in the information packet as received by the reception unit; and a correction unit for performing error correction, if required, by calculating a difference between the transmitting side syndrome value contained in the redundant packet as received by the reception unit and the receiving side syndrome value obtained by the calculation unit.

Other features and advantages of the present invention will become apparent from the following description taken in conjunction with the accompanying drawings.

DETAILED DESCRIPTION OF THE PREFERRED EMBODIMENTS

Referring now to FIG. 1 to FIG. 11, the first embodiment of a code transmission scheme according to the present invention will be described in detail.

First, the conventional general coding scheme using the error correction will be described. As an example, the case of using systematic cyclic codes will be described. Here the systematic implies that the result of the error correction coding is in a state in which the original information is left unchanged as an information section while a redundant section is formed separately from the information section so that the redundant section can be clearly separated from the information section.

In the cyclic symbols, an information series I of m symbols given by:

$$I=(i[m-1], i[m-2], \ldots, i[0]) \qquad (6)$$

can be expressed as I(X). Then, a polynomial R(X) of degree less than k is obtained with respect to the generator polynomial G(X) of degree k as follows.

$$I(X) \cdot X^k = Q(X)G(X) - R(X) \qquad (7)$$

where Q(X) is a quotient polynomial, and k is a prescribed constant.

The code word C is expressed in a form of polynomial C(X) as follows.

$$C(X)=I(X) \cdot X^k + R(X) \qquad (8)$$

In the vector expression, this code word C can be expressed as:

$$C=(i[m-1], i[m-2], \ldots, i[0], r[k-1], r[k-2], \ldots, r[0]) \qquad (9)$$

which is in a form of C=(I|R).

Suppose that this code word C is transmitted by a sender toward a receiver. Here it is assumed that communications are carried out in packet units and no bit error occurs but a dropping in symbol units occurs at an intermediate communication path. Now, the form of communications in which the dropping in symbol units can occur will be described.

Figure 1:
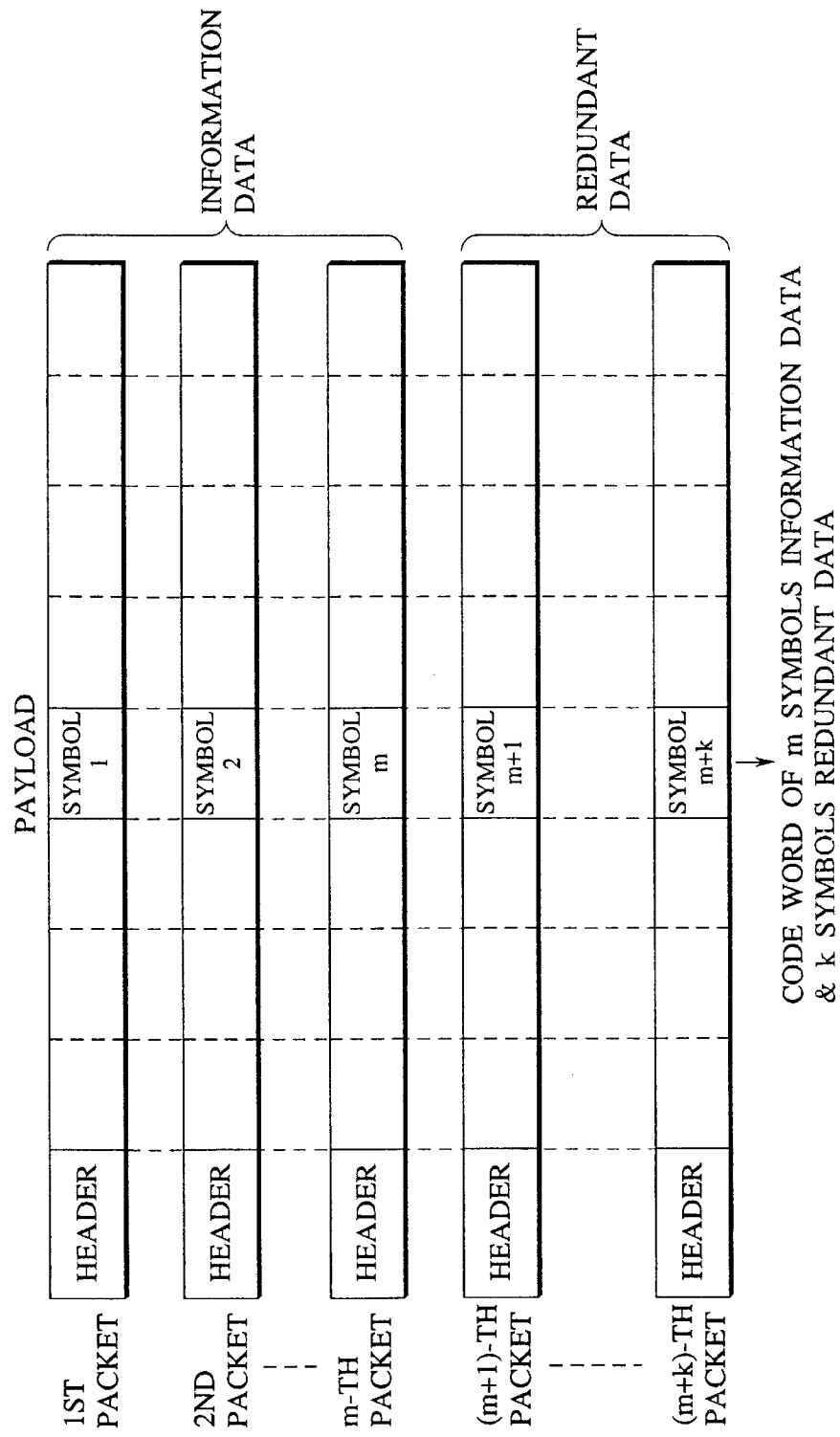
FIG. 1 is a diagram for explaining a method for producing redundant packets corresponding to information packets using fixed packet length.

FIG. 1 shows a relationship between the packet communication and the code word. As shown in FIG. 1, the code word is divided in such a manner that one symbol enters into one packet. Then, the information symbols are entered into the first packet to the m-th packet while the redundant symbols are entered into the (m+1)-th packet to the (m+k)-th packet.

Looking at the first packet, it appears as if its payload is formed by the first information symbols of a plurality of code words. Similarly, the (m+1)-th packet appears as if its payload is formed by the (m+1)-th symbols of a plurality of code words that are redundant symbols. In this manner, packets are completely divided into information packets that entirely comprises information symbols and redundant packets that entirely comprises redundant symbols.

Packets may be discarded at the router and the like and when one packet is discarded, it appears as if one symbol has been discarded from a viewpoint of each code word of FIG. 1.

Figure 2:
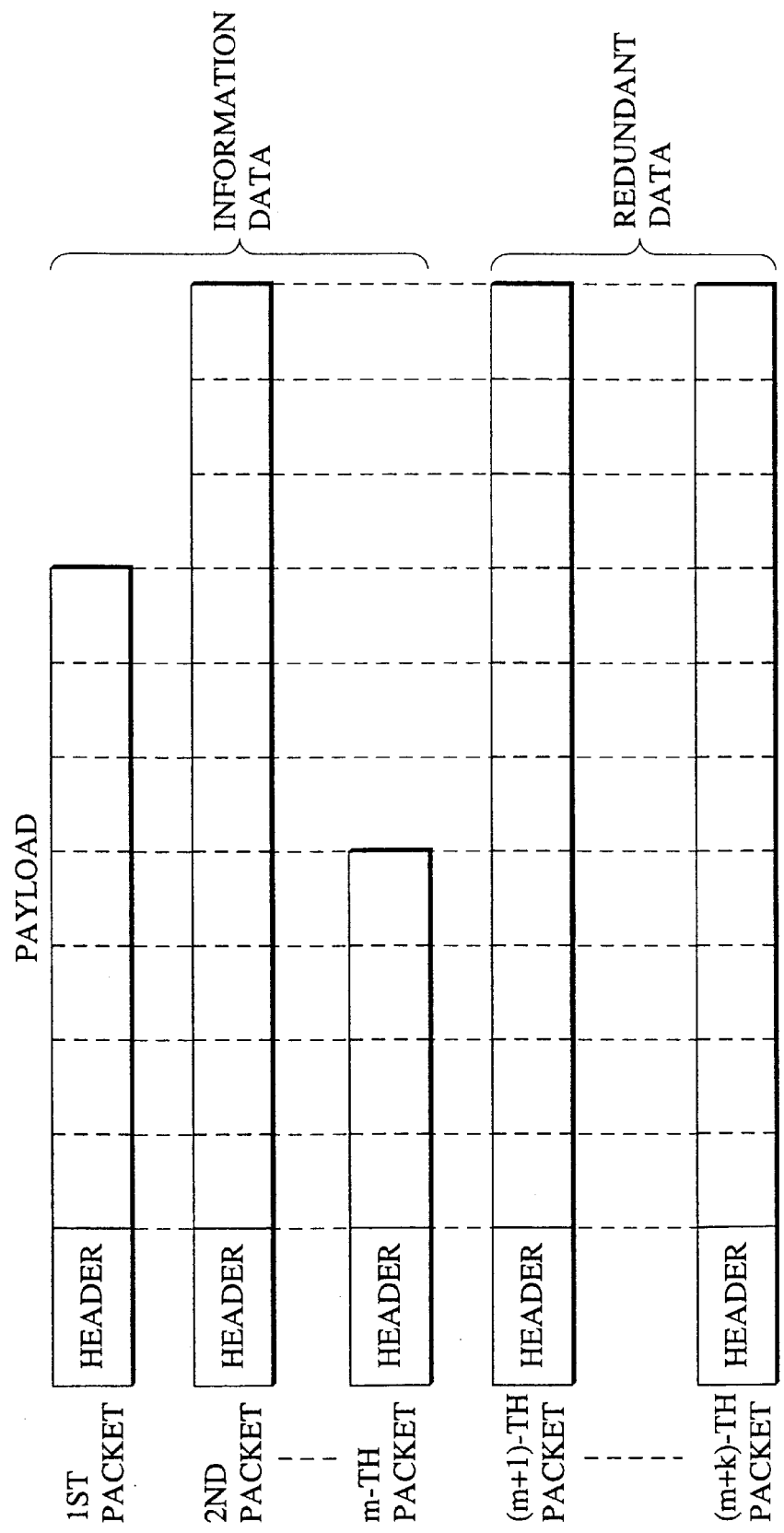
FIG. 2 is a diagram for explaining a method for producing redundant packets corresponding to information packets using variable packet length.

Note that FIG. 1 has been described for the case where all the packets have the same length, but in the case where packets with different lengths exist as shown in FIG. 2, the redundant packets are produced in alignment to the longest one (the second packet in FIG. 2) among the information packets. In this case, there can be a code word for which effectively no data are contained in symbols of the information packet part so that no information loss occurs for that code word even when some information packets are discarded.

As described, the information to be transmitted is entered distributedly into a plurality of information packets in symbols units first. Also, the redundant part to be transmitted is entered distributedly into a plurality of redundant packets in symbol units as well. By inserting this so called code word in a form of being interleaved with respect to a plurality of packets, the discarding of one packet is going to imply the dropping of one symbol for each one of a plurality (n pieces for example) of code words that are contained in that one packet. Note that, in FIG. 1 and FIG. 2, positions of symbols of a code word are neatly aligned along one column, but there is no need to align them along one column provided that the way of arranging them is determined in advance. Also, usually, one symbol from each one of a plurality of code words is entered into the payload of one packet for the sake of simplicity, but it is also possible to set the number of symbols to be inserted to two or more.

The receiving side receives a code word C' from which some symbols are dropped in this manner. The symbol dropping can be considered as equivalent to the receiving of a symbol with a value 0, so that it can be expressed as follows.

$$C'=(i[m-1], \ldots, 0, \ldots, i[0], r[k-1], \ldots, 0, \ldots, r[0]) \qquad (10)$$

On the other hand, C' can be considered as C plus an error E called dropping, where E can be expressed as:

$$E=(0, \ldots, i[*], \ldots, 0, 0, \ldots, r[**], \ldots, 0) \qquad (11)$$

The receiver carries out the division by G(X) with respect to C'(X), and obtains the residue of that division. This residue is called a syndrome. That the syndrome value is 0 implies that there is no error. When the syndrome value becomes 0 despite of the fact that there are some dropping in packets, it implies that a symbol value of the corresponding packet section is equal to the assumed value corresponding to the symbol dropping, that is 0. If is also possible to assume a value other than 0 for the symbol dropping, but it is simplest to assume 0 for-the symbol dropping.

When the syndrome value becomes a value other than 0, a value of the dropped symbol is obtained from the dropped symbol position and the syndrome value. In the case where it is possible to correct the dropping of two or more symbols, the syndrome is often expressed in a vector form in general.

In the following, the case using the RS codes on $GF(2^h)$ will be described as a representative example. The RS codes are very efficient codes that can correct the dropping of up to k symbols when there is k symbols redundancy, among many codes. Here, however, the similar method also applies to the block codes other than the RS codes so that the following description has the sufficient generality.

In the RS codes, the syndrome calculation and the correction of dropped symbols are carried out as follows. First, the generator polynomial G(X) is expressed as a polynomial of degree k in terms of a root $\alpha$ of the irreducible polynomial on $GF(2^h)$ as:

$$G(X)=(X+\alpha^b)(X+\alpha^{(b+1)}) \ldots (X+\alpha^{(b+k-1)}) \qquad (12)$$

where b is a prescribed constant (integer). On the other hand, the received code word C' is expressed in a form of a polynomial as:

$$C'(X)=i[m-1]X^{(m+k-1)}+\ldots+0X^{(\cdot)}+\ldots+i[0]X^k+r[k-1]X^{(k-1)}+\ldots+0X^{(\cdot)}+\ldots+r[0] \quad (13)$$

Using this expression, k pieces of the syndrome S[i] (i=0 to k−1) are calculated as follows.

$$S[i]=C'(\alpha^{(b+i)}) \quad (14)$$

Now, suppose that there is dropping of l symbols due to discarding of l packets, where $0<l\leq k$. Here, the dropped symbol positions will be denoted sequentially as a[l−1], a[l−2], ..., a[0], and their respective values will be denoted as e[l−1], e[l−2], ..., e[0]. The symbol positions are assumed to be arranged from (m+k−1)-th one at the top and 0-th one at the end. If there is no dropping, all S[i] will become 0, so that in terms of the values of the dropped section that remains, S[i] becomes:

$$S[i]=e[l-1](\alpha^{(b+i)})^{a[l-1]}+e[l-2](\alpha^{(b+i)})^{a[l-2]}+\ldots+e[0](\alpha^{(b+i)})^{a[0]} \quad (15)$$

Since the values at a[l−1] to a[0] are known, each symbol value can be obtained by solving simultaneous equations for l values from e[l−1] to e[0] using arbitrary l syndromes among k syndromes of S[0] to S[k−1], or by using any other solution method that has the equivalent function.

Now, as already mentioned in the description of the background art section, the conventional scheme requires the operation to divide I(X) by G(X) at the transmitting side, and there is a problem that the degree of G(X) becomes different depending on how many redundant packets are to be attached in this operation, so that the calculation method also becomes different. This does not present any problem if the number of redundant packets is always fixed but usually it is required to make the number of redundant packets variable depending on the network characteristics so that a plurality of G(X) must be prepared in correspondence to the variable number of redundant packets.

In the case of realizing this operation by hardware, in particular, the circuit size increases roughly in proportion to the degree of G(X), so that when it is required to make the number of redundant packets variable between 1 to k, for example, the required circuit size becomes:

$$1+2+\ldots+k=k(k+1)/2 \quad (16)$$

in units of a circuit size in the case of using one redundant packet. Similarly, in the case of realizing this operation by software, the required amount of software programs will increase in proportion to this circuit size of the equation (16).

In view of the above, the error correction scheme used in this first embodiment will now be described in detail.

In order to realize the error correction, it suffices to ascertain the error positions and the syndrome values as indicated in the equation (15). Consequently, if it is possible to calculate the syndrome values at the transmitting side or the receiving side without using the division calculations based on G(X) of different degrees, this calculation will be sufficient to yield the desired result. For this reason, this first embodiment uses a syndrome calculation method which does not use the division calculations based on G(X) of different degrees.

In the following, an exemplary case of using the systematic RS codes on $GF(2^h)$ will be described, but this method has a sufficient generality so that it is equally applicable to the other block codes as well. In fact, in this case the RS codes themselves are not transmitted and the information section and the redundant section are treated separately.

At the transmitting side, the same generator polynomial as that of the equation (12) is used. First, each root of G(X) is substituted into the information series I(X), to calculate a syndrome T[i] (i=0 to k−1), which will be referred to as a transmitting side syndrome value.

In other words, T[i] can be defined as remainders obtained by dividing I(X) by each one of k pieces of different polynomials of degree 1 in forms of $X-\alpha^{(b+i)}$ (i=0 to k−1). Alternatively, T[i] can be described as quantities obtained by substituting each one of k pieces of different powers of α in a form of $\alpha^{(b+i)}$ into I(X). This substitution procedure resembles the syndrome calculation in the decoding procedure for the conventional RS codes. Note however that, in the case of the conventional RS codes, the powers of α are substituted into C(X) which is the polynomial expression of the code word C, but the present invention differs from this in that the substitution is carried out with respect to the polynomial I(X) of the information part rather than the code word.

Then, the transmitting side attaches this T to the information series I, and sends D=(I|T) of a format different from the code word C, to the receiving side, as follows.

$$T[i]=I(\alpha^{(b+i)}) \quad (17)$$

$$D=(i[m-1], i[m-2], \ldots, i[0], T[k-1], T[k-2], \ldots, T[0]) \quad (18)$$

Here, the order for transmitting T[i] may be opposite to that indicated in the equation (18) instead. The method for transmitting D can be the same as that of the conventional scheme. Namely, the transmission is carried out in forms of the information packets and the redundant packets as shown in FIG. 1 and FIG. 2, and the discarding occurs in packet units. Consequently, the symbol dropping in D occurs in the middle and the receiving side receives D' resulting from the symbol dropping which is given by:

$$D'=(i[m-1], \ldots, 0, \ldots, i[0], T[k-1], \ldots, 0, \ldots, T[0]) \quad (19)$$

On the other hand, D' can be considered as D plus an error E' called dropping, where E' can be expressed as:

$$E'=(0, \ldots, i[*], \ldots, 0, 0, \ldots, T[**], \ldots, 0) \quad (20)$$

Now, if the first m elements of E' are all 0, that is, if there is no dropping for the information symbols, the entire information is normally received so that there is no need for further processing. Consequently, the redundant symbols are discarded and the information part is taken out. Also, when the number of non-zero elements in E' exceeds k, the error correction cannot be carried out by this code word in general so that no further processing is carried out. However, in the case of carrying out the re-transmission processing as will be described below, these information will be utilized later so that they should be maintained. When E' is not in these forms, that is, when there is an information symbol dropping within a range of the correction capability of the error correcting codes, the receiver carries out the error correction processing by the following procedure.

Namely, the receiver calculates the syndrome values for the first m symbols, which will be referred to as receiving side syndrome values. Namely, when D' is expressed as D'=(I'|T'), the receiver calculates:

$$T'[i]=I'(\alpha^{(b+i)}) \quad (21)$$

and then calculates a difference of T' with respect to T[i]. Here, however, when the corresponding T[i] is dropping in the transmitted D', the difference will not be calculated. In this manner, it is possible to obtain each syndrome of the received error correcting code given by:

$$S'[i]=T[i]-T'[i] \quad (22)$$

except when T[i] is unknown. When j pieces ($0 \leq j < k$) of T[i] are dropping out of all T[i] (i=0 to k−1), (k−j) pieces of syndrome values can be obtained, while there are no syndrome values for the dropped j pieces.

Then, suppose that there is discarding of l pieces of information packets ($0 < l \leq k-j$) that do not exceed the number of obtained syndrome values. Here, the dropped symbol positions will be denoted sequentially as a[l−1], a[k−2], . . . , a[0], and their respective values will be denoted as e[l−1], e[l−2], . . . , e[0]. The symbol positions are assumed to be arranged from (m−1)-th one at the top and 0-th one at the end. If there is no dropping, all S'[i] will become 0, so that in terms of the values of the dropped section that remains, S'[i] becomes:

$$S'[i]=e[l-1](\alpha^{(b+i)})^{a[l-1]}+e[l-2](\alpha^{(b+i)})^{a[l-2]}+\ldots+e[0](\alpha^{(b+i)})^{a[0]} \quad (23)$$

Since the values at a[l−1] to a[0] are known, each symbol value can be obtained by solving simultaneous equations for l values from e[l−1] to e[0] using arbitrary l syndromes among (k−j) syndromes S'[i], or by using any other solution method that has the equivalent function.

Now, this error correction scheme of the first embodiment will be compared with the conventional scheme. The amount of information to be transmitted is given by k symbols redundancy with respect to the m symbols information, which is the same for both cases. Moreover, the error correction performance is that capable of correcting dropping of up to k symbols among the information symbols and the redundancy symbols in total, which is also the same for both cases. In this situation, the circuit size required by the conventional scheme is as given by the equation (16), whereas the circuit size required by the scheme of this first embodiment is k in units of a circuit size for calculating one syndrome. Namely, the error correction scheme of this first embodiment can reduce the circuit size. Similarly, in the case of realizing this operation by software, the required amount of software programs can be reduced in proportion to this circuit size reduction.

Figure 3:
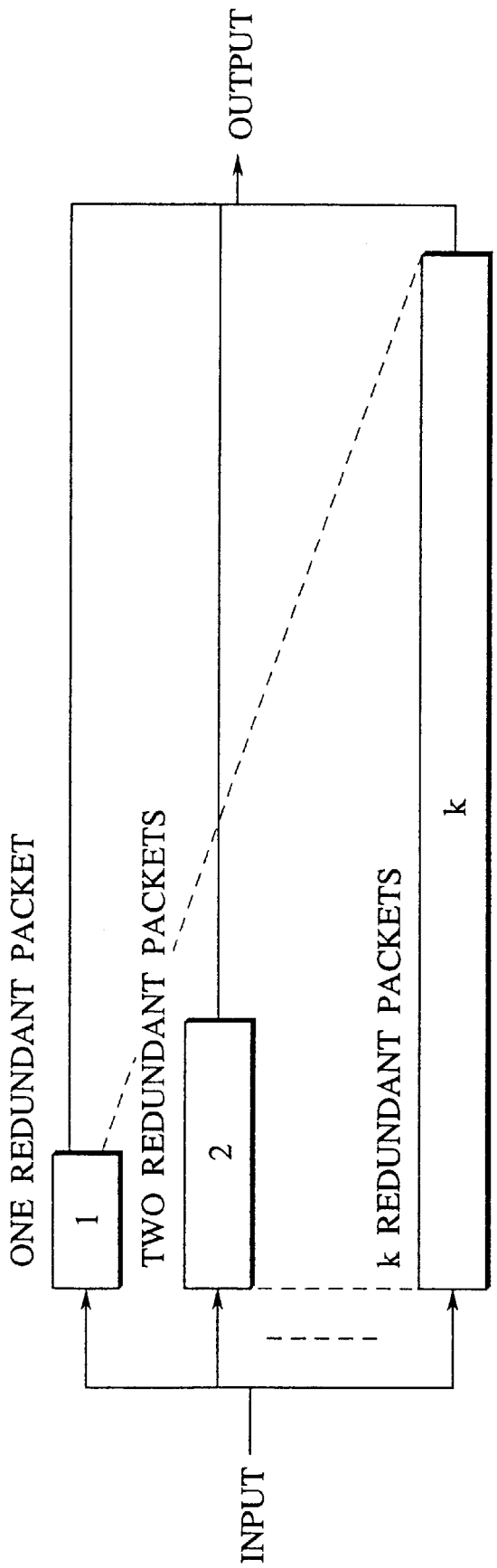
FIG. 3 is a schematic diagram showing a circuit configuration on a transmitting side according to a conventional error correction scheme.
Figure 4:
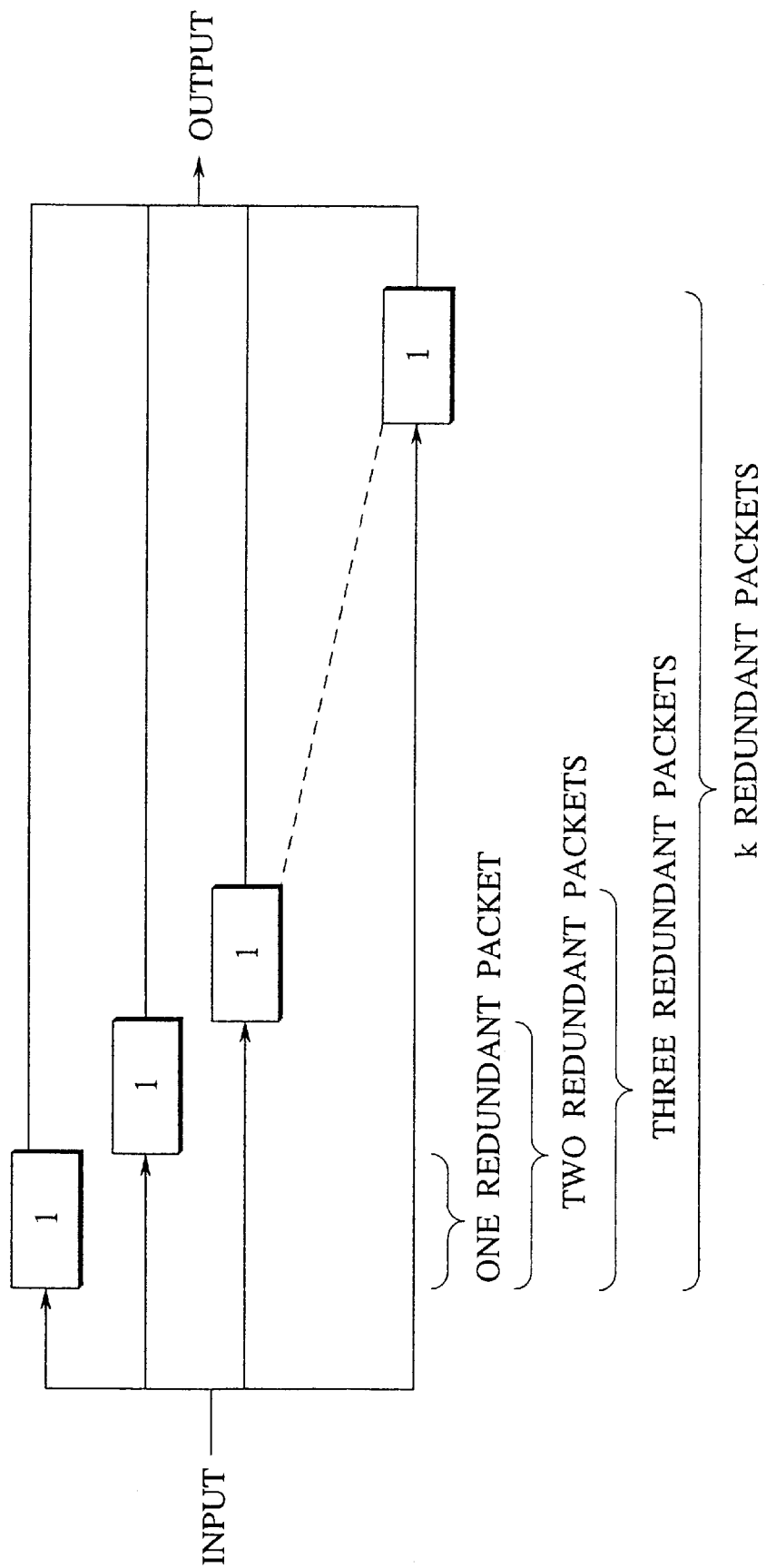
FIG. 4 is a schematic diagram showing a circuit configuration on a transmitting side according to the first embodiment of the present invention.

FIG. 3 and FIG. 4 conceptually show the required circuit sizes in the conventional scheme and the scheme of this first embodiment, respectively. The transmission side circuit in the conventional scheme as shown in FIG. 3 has a large total circuit size because the totally different circuits are required for different numbers of redundant packets to be used. On the other hand, the required circuit size in the error correction scheme of the first embodiment as shown in FIG. 4 can share the same circuit even when the number of redundant packets is varied so that the required circuit size becomes considerably smaller.

Thus by calculating the syndrome values only with respect to the same symbol section at the transmitting side and the receiving side and using these syndrome values, it is possible to realize the communication system that requires a smaller circuit size or amount of software programs.

In particular, when the method used for decoding of the RS codes is used for the syndrome calculation to calculate each T[i] or T'[i], it is possible to realize the maximum error correction performance.

Next, an exemplary communication system incorporating the above described code transmission scheme of the first embodiment will be described in detail.

This communication system is a system which carries out end-to-end error correction using IP packets with error correction function (IP-FEC packets).

Figure 5:
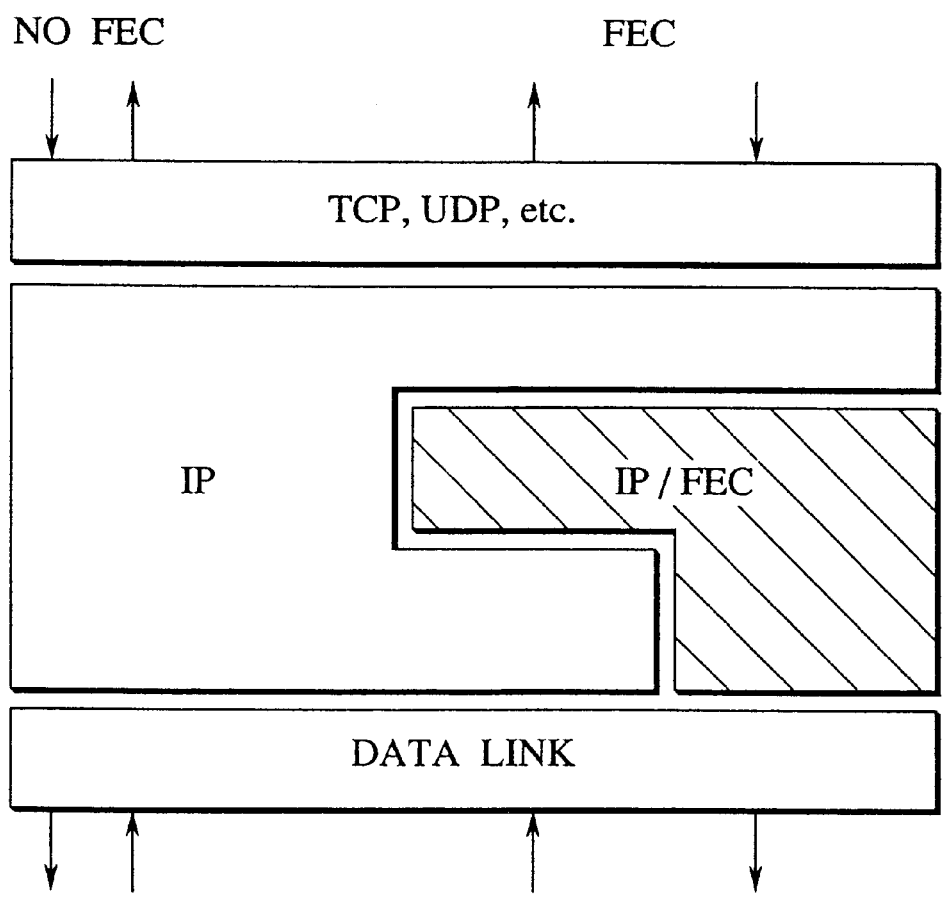
FIG. 5 is a diagram showing a layer image in an IP packet communication system according to the first embodiment of the present invention.

FIG. 5 shows a layer structure of this system, in which a layer called IP/FEC is provided around the IP layer such that the error correction can be carried out independently with respect to various transport layers (TCP, UDP, etc.) at this IP/FEC layer.

Figure 6:
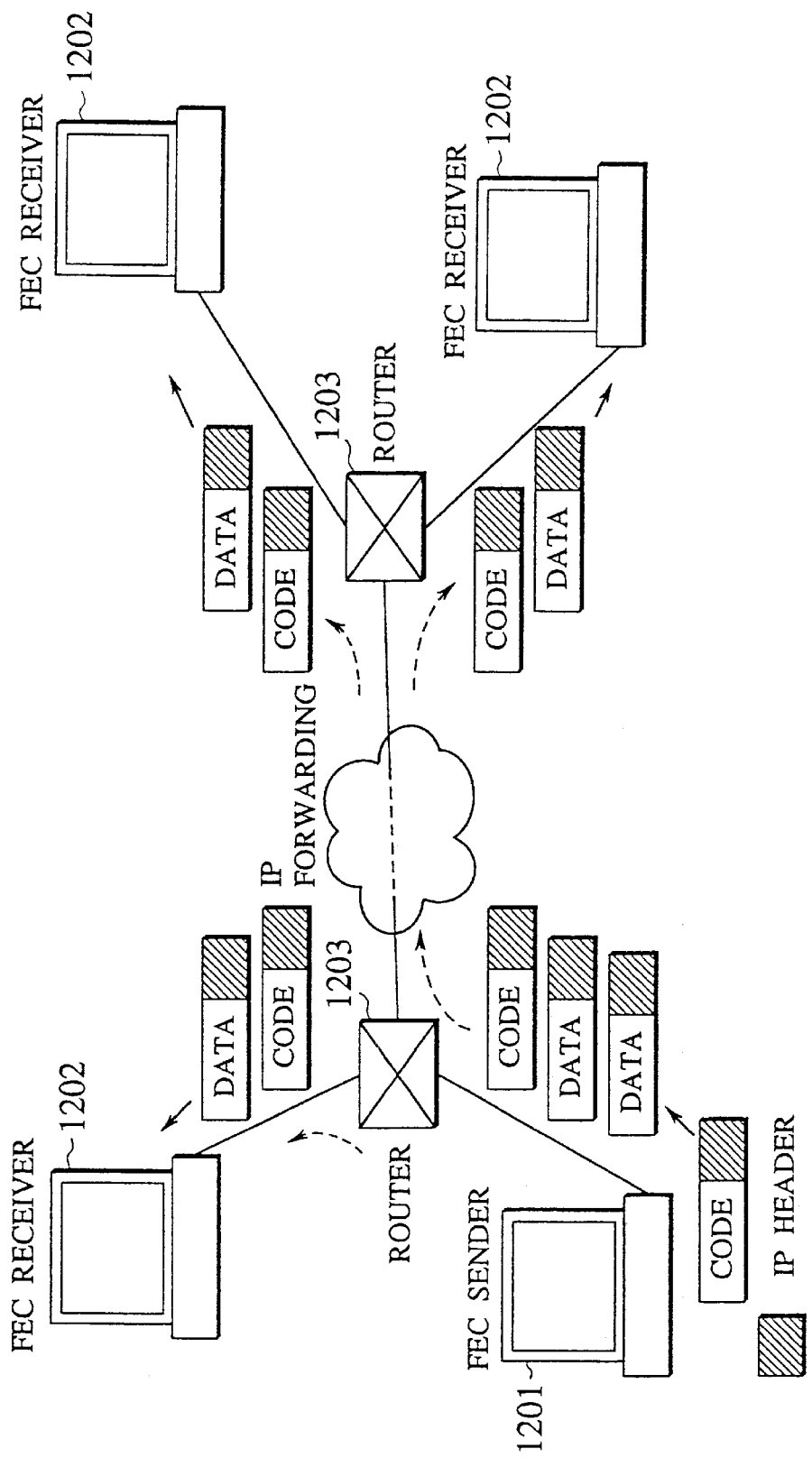
FIG. 6 is a schematic diagram showing an operation state of an IP packet communication system according to the first embodiment of the present invention.

FIG. 6 shows a manner of actual operation in this communication system. In the world of Internet and the like, computers (a transmission terminal (FEC sender) 1201 and reception terminals (FEC receivers) 1202) are connected end-to-end through routers 1203 around the globe, as shown in FIG. 6. It is also expected that communications using multicast in particular will increase in future.

However, in the current state of the art, even for errors such as packet discarding that occurs within the network, it is required to carry out the error correction using a method based on re-transmission similar to that used between terminals within LAN.

Originally the error correction based on re-transmission is designed to be effective in media for which real time communications are not required, in the case where a distance between terminals is short. However, in the case where it is difficult to predict a change of data traffic as the network becomes huge, it is expected that the error correction based on FEC is more appropriate.

In the method based on FEC, the actual data are transmitted by attaching error correcting codes thereto in advance, and when the errors occur during the transfer, the receiving side voluntarily makes corrections using the correcting codes. Consequently, it is possible to prevent an increase of network traffic due to re-transmission, and it is also possible to save memory as there is no need to store data for a certain period of time at the transmitting side in anticipation of a re-transmission request. The re-transmission scheme is particularly not suitable for the multicast in the huge network because of the factors associated with it such as an increase in delay, an increase in traffic, a complication of connection management, etc.

Now, the processing at the transmitting side in this communication system will be described with reference to the diagram of FIG. 7.

First, the FEC layer receives an IP packet from the IP layer (network layer). Here, this received IP packet will be referred to as an original IP packet 1301. Then, this original IP packet 1301 including its header is written into a memory buffer region called interleave matrix 1302. This writing is carried out by sequentially writing data in the vertical direction of the interleave matrix 1302. One vertical column often has a fixed size such as 128 bytes, 512 bytes, or 1024 bytes, but it is set to be variable in this embodiment. Since the original IP packet 1301 is of a variable length, there can be a case in which the data ends in a middle of the last column. In such a case, the padding (PAD) is attached to the last column.

Figure 7:
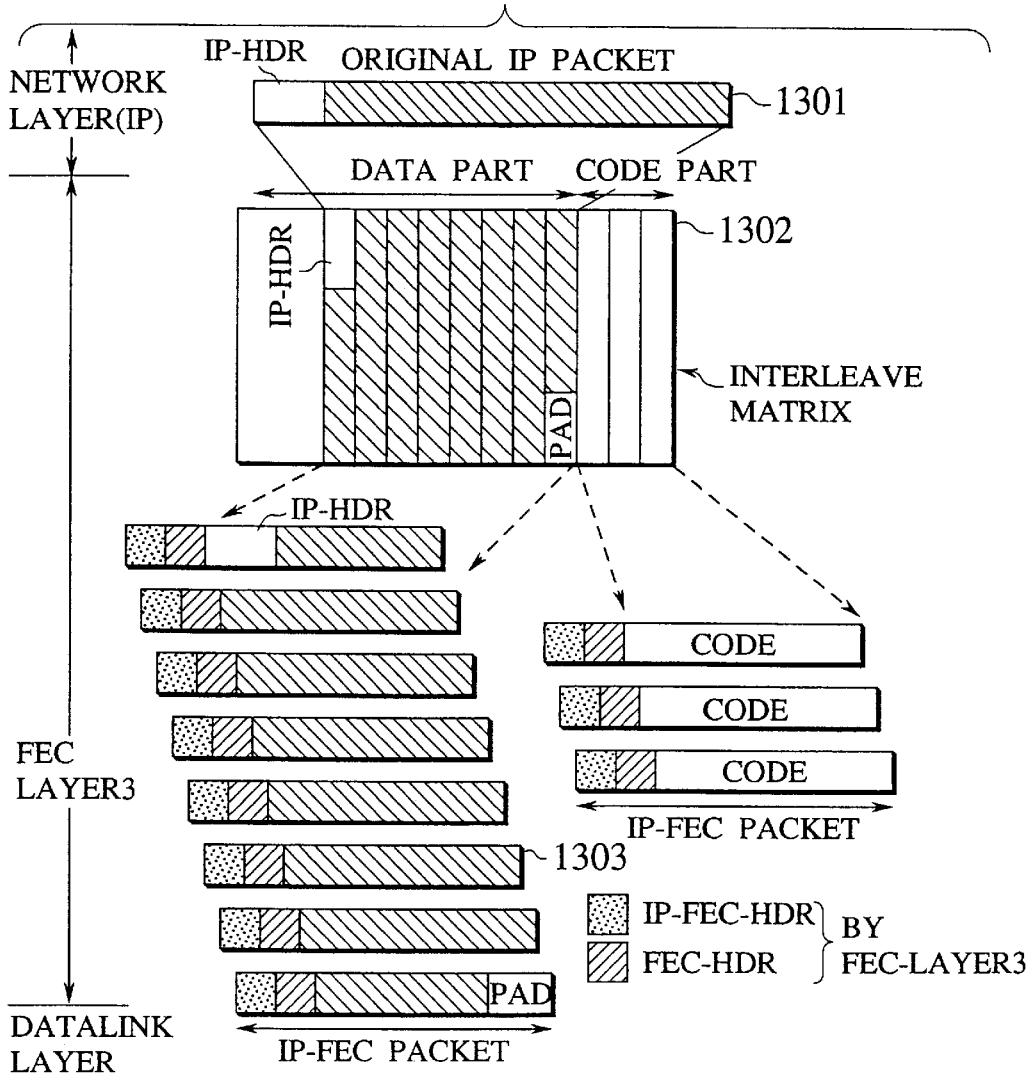
FIG. 7 is a diagram showing an operation on a transmitting side in the IP packet communication system of FIG. 6.

Next, the error correction coding calculation is carried out for each horizontal row, and the coded data obtains as a result of this calculation is written into a portion corresponding to the the same row in a code part provided at the right side of the interleave matrix 1302 as shown in FIG. 7. The horizontal size has the maximum length determined according to a size of symbol used for the error correction, and more specifically becomes $2^8-1$ when the number of bits for one symbol is B. This size corresponds to the maximum total number for vertical columns for data and vertical columns for codes.

Actually, the above described interleave matrix can be set in correspondence to FIG. 1 or FIG. 2. Here, the case of setting it in correspondence to FIG. 1 will be described. The payload section in FIG. 1 corresponds to the vertical column of the matrix. Consequently, in FIG. 1, the original IP packet is segmented from the top into m pieces each containing the same number of symbols (assumed to be n symbols here), and these pieces are entered distributedly into the payloads of the first packet to the m-th packet. Then, the j-th symbols (j=1 to n) of the first packet to the m-th packet are used to produce k pieces of the redundant symbols. The method for production is as already described above. Then, these k redundant symbols are written into the j-th symbol positions of the (m+1)-th packet to the (m+k)-th packet respectively. When the similar operation is carried out for n symbols, the payloads of the (m+1)-th packet to the (m+k)-th packet will be filled by the redundant symbols.

FIG. 1 produces k pieces of j-th symbols from m pieces of j-th symbols, but when the correspondence is clearly established, the calculation may be carried out by changing the symbol orders. Namely, the j[i]-th symbols (j[i]=1 to n) of the i-th packets (i=1 to m) can be taken out and set as m pieces of information symbols, and each one of k pieces of redundant symbols obtained from these m pieces of information symbols can be written into one of arbitrary symbol positions in the (m+1)-th packet to the (m+k)-th packet. At this point, when m pieces of information symbols to be selected are selected without any overlap and the positions to write the redundant symbols are chosen without any overlap, the redundant packets having the similar correction capability can be produced.

The error correction coding method is the same as already described above, and the calculation is carried out in symbol units along horizontal direction. Here, an empty portion on the left side of the matrix will be ignored. It is also possible to change the level of coding for each matrix. For example, the coding parameters can be changed according to the length of the original IP packet 1301 and the connection type.

Next, an FEC header is attached to each vertical column in which data are stored. One vertical column becomes one IP packet when it is in a state of having this FEC header and an IP-FEC header attached thereto. Here, an IP packet with a short fixed length will be referred to as an IP-FEC packet 1303.

Figure 8:
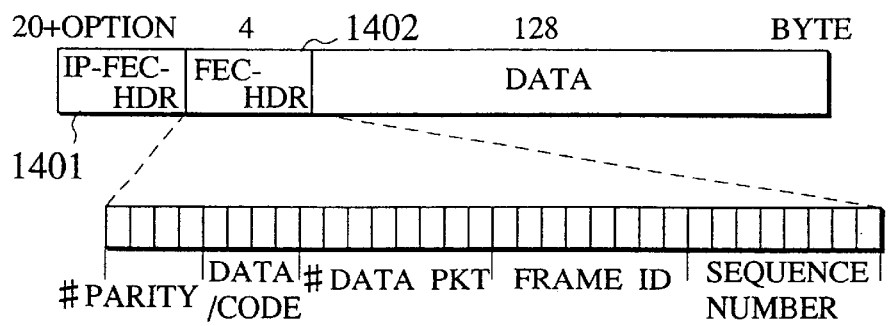
FIG. 8 is a diagram showing a configuration of an FEC header within an IP packet used in the IP packet communication system of FIG. 6.

FIG. 8 shows an exemplary data contained in the FEC header. As shown in FIG. 8, the FEC header 1401 comprises four bytes and has the following fields.

parity:

This indicates how many correction symbols are attached with respect to each horizontal row of the matrix. A number of correction symbols attached may be different for different matrices.

data/code:

This indicates whether a payload to which this FEC header is attached contains data or correcting codes.

data pkt:

This indicates a number of vertical columns for data that are contained in this matrix.

Frame ID:

This is an ID number which is to be sequentially incremented at the transmitting side in units of matrices. The IP layer carries out the connection-less communications so that there can be a case in which the arrival orders of packets at the receiving side may be interchanged. For this reason, the information for identifying a packet order is entered by the transmitting side in advance, so as to make it possible to judge the interleave matrix to which the arrived packet belongs.

SN:

This is a sequence number to be initialized and attached for each matrix. Namely, this SN is used for identifying the packet within some interleave matrix. No packet with the same SN exists within the same matrix.

Next, the IP-FEC header 1402 is attached, This is basically a copy of the header of the original IP packet 1301 as attached thereto when the original IP packet 1301 is given from the upper layer. The differences are that a protocol field is set up in the FEC, that a total length of a packet is set to be a sum of the IP-FEC header length (20 bytes+option), the FEC header length (four bytes in the example of FIG. 8), and a vertical length of the interleave matrix (128 bytes, 512 bytes, etc.), and that a checksum is to be re-calculated.

When the IP-FEC header 1402 is attached, the completed IP-FEC packets 1303 are sequentially given to the datalink layer.

Next, the processing on the receiving side in this communication system will be described with reference to the diagram of FIG. 9.

When the IP-FEC packet 1503 is brought up from the datalink layer, it is first received by the IP layer. At the IP layer, the IP-FEC packet 1503 is handled similarly as the usual IP packet, and then given to the FEC layer according to a content (FEC) of the protocol field of the header. The IP-FEC header can be interpreted at the IP layer.

At the FEC layer, the IP-FEC header is taken out from the IP-FEC packet 1503 to carry out the FEC header check, and the payload portion is vertically written into an appropriate column of an appropriate interleave matrix 1502 according to the information of frame ID and SN shown in FIG. 8. Here the correct arrival order is not guaranteed in the IP transfer so that it is made possible to maintain a plurality of frames simultaneously as shown in FIG. 9.

Figure 9:
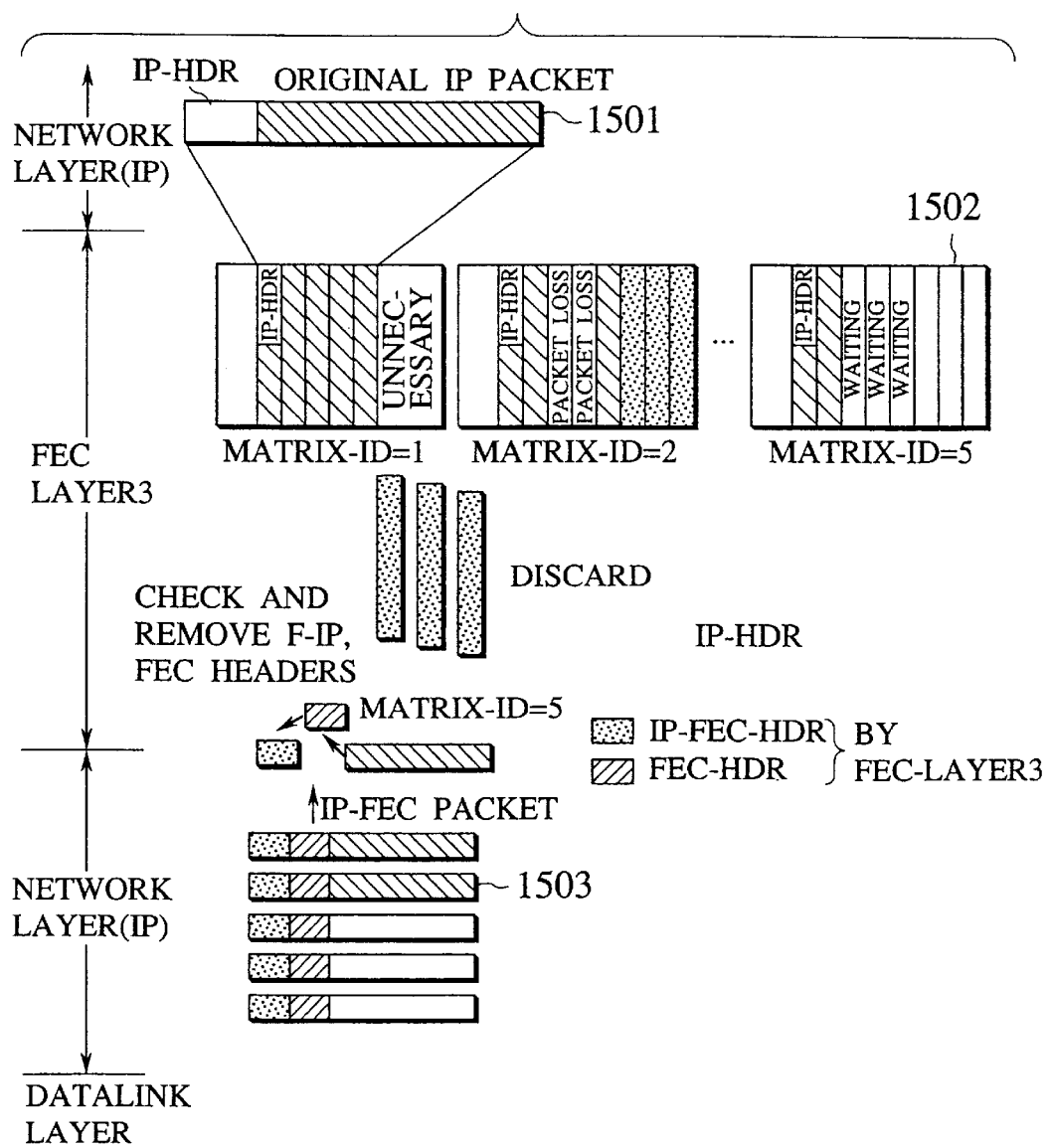
FIG. 9 is a diagram showing an operation on a receiving side in the IP packet communication system of FIG. 6.

When the portions corresponding to the data part are filled as in the leftmost interleave matrix of FIG. 9, the assembling of the original IP packet 1501 is completed so that the IP-FEC packet of the code part are discarded as unnecessary.

Also, in the case of a matrix shown in a middle of FIG. 9, all portions of the code part have arrived but not all portions of the data part have arrived yet so that it is regarded that a packet loss may have occurred. For this reason, it is set in a standby state for an opportunity to carry out the error (loss) correction.

When the original IP packet is assembled without any packet loss or the original IP packet is recovered by the error correction despite of the packet loss, this original IP packet is given to the IP layer again.

The interleave matrices have a predetermined maximum number of data that can be maintained simultaneously, so that when the number of data exceeds that maximum number, the matrix that is maintaining data for the longest period of time is searched out and the correction processing for data written in this matrix is started. It is also possible to provide a timer and start the correction processing even in the case where data are not filled in the matrix after a prescribed period of time has elapsed.

The correction method is the same as already described above, When there are too many packet losses in excess of the correction capability in the interleave matrix for which the correction processing is attempted, the correction is abandoned and data of the entire matrix are discarded. When the correction succeeds, the completed original IP packet is taken out and given to the IP layer.

In this manner, by making it possible to carry out the error correction of the present scheme, it is possible to realize the end-to-end data delivery through routers, etc., and it is possible to realize the reliable communications as the receiving side carries out the error correction whenever necessary according to the information from the transmitting side. In particular, this scheme does not depend on the number of receivers so that it is also suitable for a large scale multicast transmission scheme. Moreover, this scheme does not depend on the transport protocol, so that it is applicable to a plurality of transport protocols such as TCP, UDP, and ICMP.

Next, exemplary configurations of a transmission device and a reception device for realizing communications in the above described communication system will be described.

Figure 10:
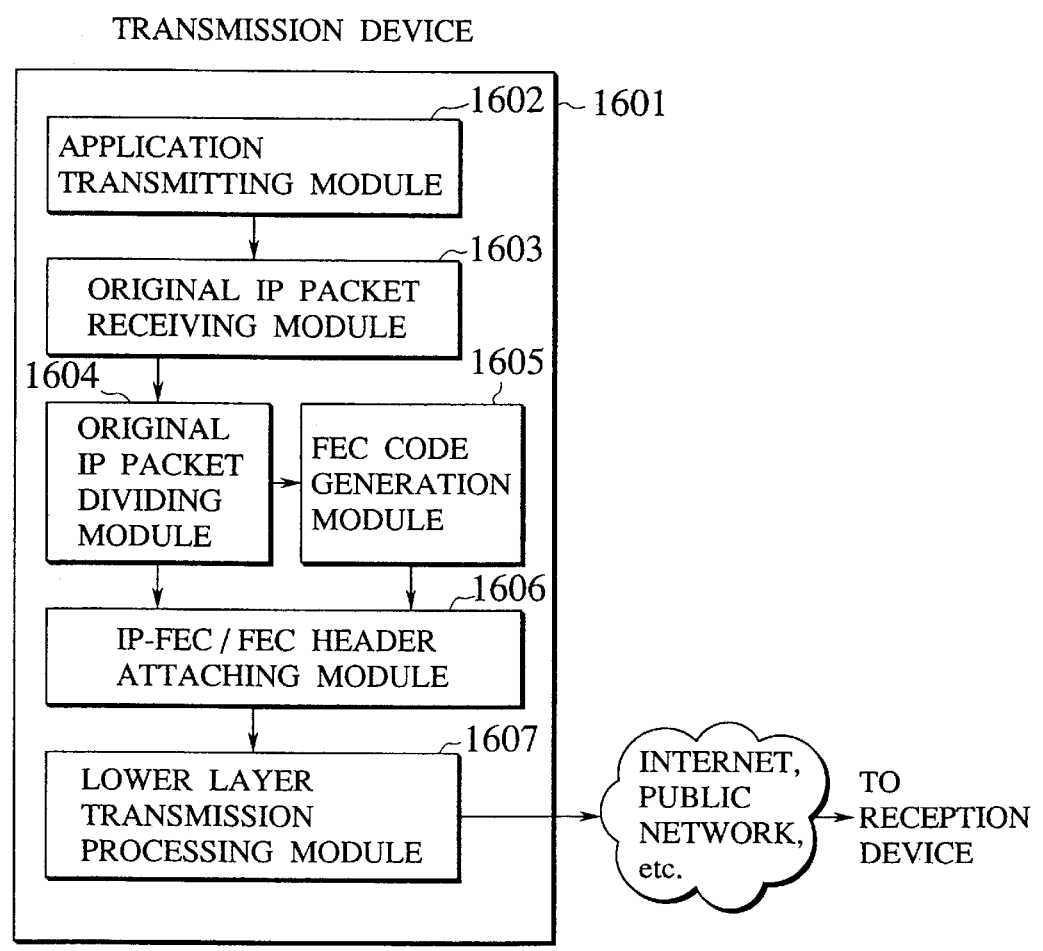
FIG. 10 is a block diagram showing a configuration of a transmission device in the IP packet communication system of FIG. 6.

First, the transmission device will be described. FIG. 10 shows an exemplary configuration of a transmission device according to this embodiment. This transmission device 1601 comprises an application transmitting module 1602, an original IP packet receiving module 1603, an original IP packet dividing module 1604, an FEC code generation module 1605, an IP-FEC/FEC header attaching module 1606, and a lower layer transmission processing module 1607.

The application transmitting module 1602 divides the application data to be transmitted in IP packet units, and give them to the original IP packet receiving module 1603. Thus the original IP packet receiving module 1603 is going to receive data that are already set completely in IP packet forms. More specifically, the functions of the application transmitting module 1602 include all the processing above the IP layer such as a processing of division into IP packet sizes, an IP packet attaching processing, a transport layer processing, etc.

The original IP packet that arrived at the original IP packet receiving module 1603 is then divided into appropriate lengths by the original IP packet dividing module 1604. The division size used here can be an arbitrary length within a range of the predetermined maximum value as described above, but it is preferable to set a fixed length in order to simplify the processing at the IP-FEC/FEC header attaching module 1606 to be described below. Namely, the original IP packet Including the IP header is segmented in units such as 128 bytes or 512 bytes, and any fragment that is left at the end will be turned into the same size by attaching a padding. The data segmented into fixed length units are then given to the IP-FEC/FEC header attaching module 1606.

At the same tine, the -information on divided data of the original IP packet is given to the FEC code generation module 1605. The FEC code generation module 1605 divides the divided data in symbol units from the top, and generates the error correcting codes using the order and values of the obtained symbols. The use of this information in the present coding scheme is the same as in the case of RS codes. A concrete method for generating codes is as already described above.

The redundant symbols generated at the FEC code generation module 1605 are arranged among the divided symbols according to a prescribed rule. For example, as shown in FIG. 1, the j-th symbols of the divided data can be used as information symbols, and corresponding redundant symbols are generated for these information symbols and then these redundant symbols are inserted also as j-th symbols in forms of divided data. In this manner, the redundant data and the information data in the same size can be obtained. The obtained redundant data are given to the IP-FEC/FEC header attaching module 1606.

Note that it is also possible to carry out the coding processing by dividing one original IP packet. For example, suppose that the original IP packet is divided into m data parts by the original IP packet dividing module 1604. In this case, these m pieces can be divided into groups of ma pieces. mb pieces and mc pieces, or groups of md pieces each, and a corresponding FEC is generated for each of them. In such a case, the coding processing is going to be carried out twice or sore for one original IP packet.

The actual original IP packet has the maximum length of about 64 kbytes so that a value of m becomes quite large when a unit of division is 128 bytes, for example. In such a case, it is effective to adopt the above described method for carrying out the coding processing by dividing the original IP packet. Also, it is necessary to change a unit of coding according to the network characteristic, and the above described method for carrying out the coding processing by dividing the original IP packet can be utilized in such a case. Note that in such a case an information as to which code within the original IP packet corresponds to this IP-FEC packet is to be added to the FEC header shown in FIG. 8.

As for an amount of redundant data to be generated at the FEC code generation module 1605, it can be judged according to the header information of the original IP packet when it can be determined in IP packet header units. Also, when it can be determined according to the number of packets for data, the length of the entire packet can be judged from a length indication contained in the header of the original IP packet, a length of division at the original IP packet dividing module 1604, etc., and the number of redundant packet can be determined according to the Judged length of the entire packet. In this manner, the FEC code generation module 1605 carries out exchange of such information with respect to the original IP packet receiving module 1603.

Now, the IP-FEC/FEC header attaching module 1606 attaches the FEC header as shown in FIG. 8 to the information data and the redundant data given to it, and further attaches an IP-FEC header, and then give them to the lower layer transmission processing module 1607. The lower layer transmission processing module 1607 then transmits the IP-FEC packets given to it by setting them into format of a transmission path capable of transmitting them, toward Internet, public network, LAN, etc.

Note that this transmission device can carry out the pipeline processing for the IP-FEC packets of data.

Upon receiving the data in fixed length (such as 512 bytes) from the original IP packet receiving module 1603, the original IP packet dividing module 1604 can carry out the series of operations by which that information is sent to the FEC code generation module 1605 while it is given to the IP-FEC/FEC header attaching module 1606 so that it is attached with various headers there and then transmitted from the lower layer.

In this manner, it is possible to omit a step for sequentially storing the entire original IP packet in the original IP packet transmission processing, so that it is possible to reduce the required buffer/memory amount. Namely, in the data processing that takes place beyond the original IP packet dividing module 1604, it suffices to provide a storage amount for one IP-FEC packet at most. In addition, as there is no need to spend time for sequential storing, it is possible to make the processing faster.

Moreover, even at the FEC code generation module 1605, in the case of generating codes, it is necessary to provide as large memory region as the number of redundant IP-FEC packets to be generated and sequentially store the intermediate calculation results there, but after the calculation is completed, data are given in units of a payload of one redundant packet to the IP-FEC/FEC header attaching module 1606 so that it suffices to secure a storage amount for one IP-FEC packet in the subsequent processing again. In addition, it is also possible to save the memory further by sharing the memory among data packets and redundant packets in the processing subsequent to the IP-FEC/FEC header attaching module 1606.

Also, with respect to the IP-FEC/FEC header attaching module 1606, after the payloads of as many data packets as should be transmitted from the original IP packet dividing module 1604 are given, the payloads of redundant packets corresponding to these data packets should preferably be given from the FEC code generation module 1605 immediately. This is because the FEC header is attached with the sequence number as indicated in FIG. 8 and it is cumbersome to manage a plurality of such sequence numbers in connection units or original IP packet units. For this reason, by optimizing the order for giving the packet payloads, it becomes possible to carry out the continuous processing at least for one coding unit. In this manner, the sequence number management can be simplified into just one type.

Figure 11:
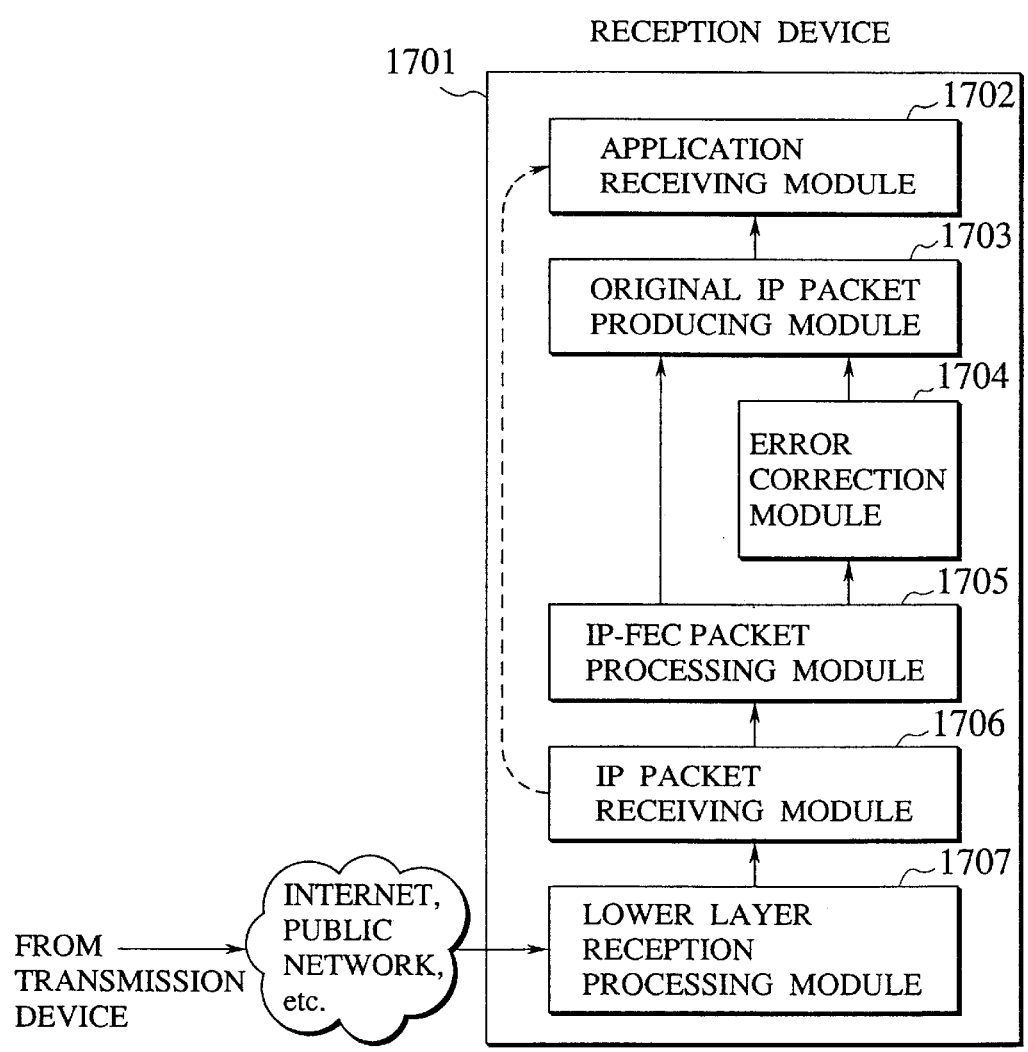
FIG. 11 is a block diagram showing a configuration of a reception device in the IP packet communication system of FIG. 6.

Next, the reception device will be described. FIG. 11 shows an exemplary configuration of a reception device according to this embodiment. This reception device 1701 comprises an application receiving module 1702, an original IP packet producing module 1703, an error correction module 1704, an IP-FEC/FEC packet processing module 1705, an IP packet receiving module 1706, and a lower layer reception processing module 1707.

The information arrived from the transmission device via Internet, public network, LAN, etc., is first processed at the lower layer reception processing module 1707, and IP packets are extracted that information and given to the IP packet receiving module 1706. The lower layer processing includes the error correction/re-transmission, the data discarding, etc., at the lower layer. When data is discarded, the normal reception of the IP packet corresponding to that data is going to be impossible.

The IP packet receiving module 1706 carries out almost the same processing as the IP layer processing in the usual communication processing. Namely, the IP address check (as to whether it is destined to this device or not), the length check, etc., are carried out and the IP packet that cannot be received will be discarded. Then, an address to which this IP packet should be given from this device as written in the IP header is checked. If the name of the layer above the IP layer such as TCP for example is written there, it implies the application receiving module 1702 so that the IP packet is directly given to the application receiving module 1702. When a code indicating the IP-FEC processing is written in the IP header, it implies that this IP packet is actually an IP-FEC packet. In this case, the IP packet receiving module 1706 removes the IP-FEC header from the IP packet and gives it to the IP-FEC packet processing module 1705.

The IP-FEC packet processing module 1705 is provided with a plurality of interleave matrices for payloads of arrived IP-FEC packets. The IP-FEC packet processing module 1705 writes the payload of the IP-FEC packet into an appropriate position of the corresponding interleave matrix according to the information of the IP-FEC header from the IP packet receiving module 1706 and the information of the FEC header given to it. The interleave matrix is formed for each unit that is coded at the transmission device 1601. In the concrete procedure for the reception device 1701, those having the same frame ID in the FEC header will be entered into the same interleave matrix in principle-. However, even among those having the same frame ID, if the FEC header contains an identifier for indicating an order in addition, the interleave matrix for each identifier is formed. This identifier is an identifier used in the case of carrying out the coding processing for twice or more with respect to one original IP packet at the transmission device 1601.

In such plural interleave matrices, the states are managed by using a timer, the number of matrices, etc. For example, when the data part is filled before the timer becomes time out, there is no need to carry out the error correction at that interleave matrix, so that only data of the data part are concatenated in an order of the sequence numbers and sent to the original IP packet producing module 1703. Then, the remaining redundant part is discarded. In this case, the error correction module 1704 will not be used and its processing is skipped.

On the other hand, when the data part of the interleave matrix is not filled even after the timer becomes time out, the number of IP-FEC packet payloads that are short in that matrix is counted, and if the counted number is not greater than the maximum number of packets that can be error corrected, data are given to the error correction module 1704 in order to carry out the error correction, If the counted number exceeds the maximum number of packets that can be error corrected, the error correction is impossible so that the entire matrix is discarded at this point.

Here, for some payload, an interleave matrix into which it should be entered may not exist in the following two cases. The first case is the case where this payload is the first one to arrive for some coded packet. In this case, a new interleave matrix is generated and this payload is stored at an appropriate position therein. The necessary interleave matrix size can be obtained from the information of the FEC header. The second case is the case where this IP-FEC packet arrived too late so that the processing of the corresponding interleave matrix has already been finished. In this case, either this packet payload is simply discarded by storing the frame IDs that are used recently, or a new interleave matrix is generated similarly as in the case of new arrival such that the content of this matrix will be discarded as a result of the time out because it will not be filled before the time out.

Next, the processing of the error correction module 1704 will be described for an exemplary case where the packet has a fixed length as shown in FIG. 1.

The error correction is carried out over a plurality of packet payloads, and obtains the code word by counting the symbols from the top of each payload and arranging symbols at the same position (the third one, the tenth one, etc.) according to the sequence numbers of the packets. The data symbols at some position are set as symbol-1 to symbol-m as in FIG. 1, and the syndrome corresponding to them is calculated. The method for calculating the syndrome is as already described above, and the calculation is carried out by regarding a symbol value of a data dropping portion as 0, for example. In the present invention, the syndrome obtained by this calculation is called the receiving side syndrome or the second syndrome, while the syndrome corresponding to the symbols of the redundant part is called the transmitting side syndrome or the first syndrome. By comparing these two syndrome values, it is possible to recover the lost symbols corresponding to the data part from their difference.

As a result of recovering each symbol, the payload of the data packet is recovered. Then, only data of the data part are concatenated in an order of the sequence numbers and given to the IP packet producing module 1703. The redundant part is no longer necessary at this point so that it is discarded.

The original IP packet producing module 1703 recovers the original IP packet by using data series without error as given from the IP-FEC packet processing module 1705 and data series with error corrected as given from the error correction module 1704. Here, the processing becomes different depending on whether identifiers for indicating an order within the same frame ID exist or not, and each case will now be described.

In the case where the above described identifiers do not exist, the data series should be having an IP header at the top, so that the length of the padding attached at the end of that data series is ascertained from the length indication given in that IP header, and the padding is removed. In this manner, the original IP packet can be recovered. This original IP packet is then given to the application receiving module 1702 for the upper level processing.

In the case where the above described identifiers exist, the identifier and the frame ID of each data are notified from the IP-FEC packet processing module 1705, and the processing waits until the data series with all the identifiers corresponding to that frame ID arrive. When the data series with all the identifiers arrive, they are concatenated in an order of the identifiers. The subsequent processing with respect to this concatenated data series is the same as in the case where the above described identifiers do not exist.

Also, a timer is provided and when the entire data series does not arrive before a prescribed time, the entire data series belonging to the corresponding frame ID is discarded. Alternatively, as a more active method, if there are data which are discarded as complete data were not available at the IP-FEC packet processing module 1705, their frame ID and identifiers are notified to the original IP packet processing module 1703 so that the discarding processing can be carried out quickly and the memory buffer amount required for the purpose of waiting can be reduced. In practice, the IP packets transmitted from the same transmission device to the same reception device do not change their routing path so often so that the IP packets arrive in order, and therefore it is often more effective to use the more active latter method in view of the memory reduction.

Finally, the application receiving module 1702 carries out all the reception processing of the layer above the IP layer. The communication processing on the transport layer, etc., is also included in this processing.

Figure 12:
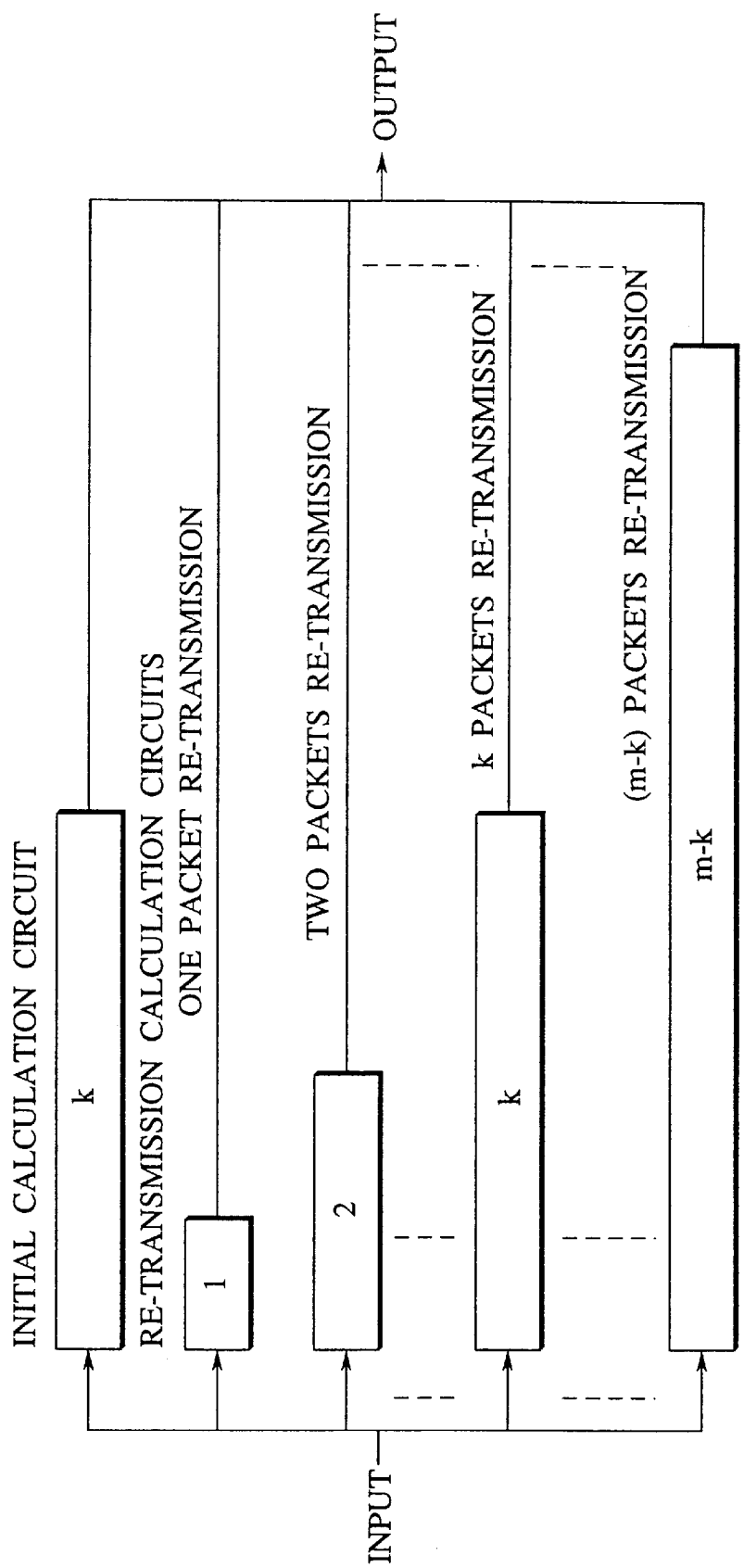
FIG. 12 is a schematic diagram showing a circuit configuration on a transmitting side according to a conventional error correction and re-transmission control scheme.
Figure 13:
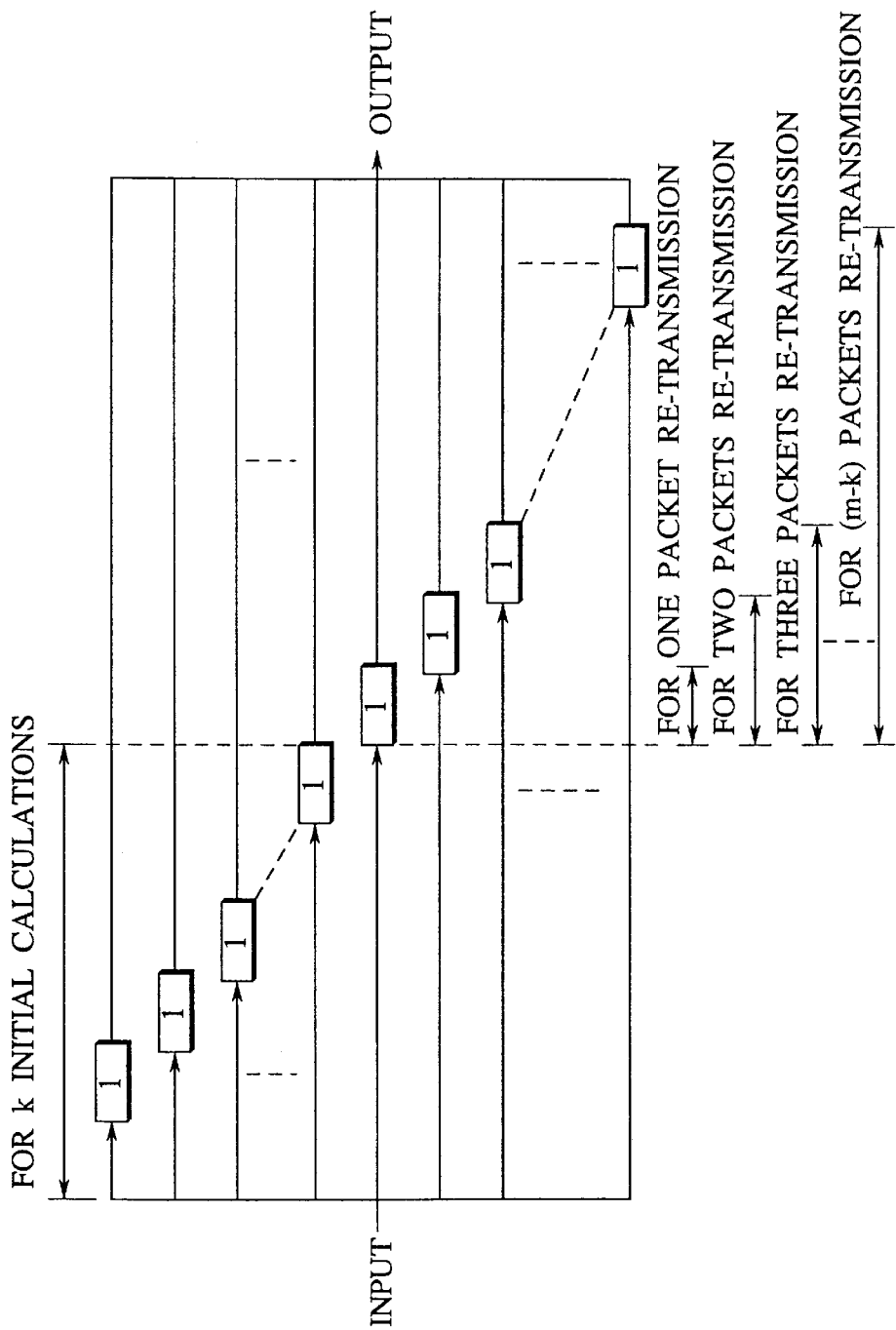
FIG. 13 is a schematic diagram showing a circuit configuration on a transmitting side according to an error correction and re-transmission control scheme of the second embodiment of the present invention.

Referring now to FIG. 12 and FIG. 13, the second embodiment of a code transmission scheme according to the present invention will be described in detail.

In the communication system, there are many applications which require reliable communications, and there are two methods for realizing the reliable communications including a method for carrying out the error correction and a method for carrying out re-transmission control. It is also possible to secure the reliability efficiently by combining these two methods.

This second embodiment differs from the first embodiment in that, instead of simply adding the error correction function, the recovery by the re-transmission control is also carried out for those packets which cannot be corrected by the error correction function.

The basic procedure in this second embodiment is as follows.

(1) From the transmitting side, m pieces of the information packets are sent to the receiving side by attaching k pieces of redundant packets, where k is an integer greater than or equal to 0.

(2) At the receiving side, when more than k packets out of m+k packets do not arrive, a re-transmission request is sent to the transmitting side.

(3) In response to the re-transmission request from the receiving side, the transmitting side re-transmits the necessary information.

Here, the conventionally known methods of re-transmission includes a method for re-transmitting all of m+k packets, a method for re-transmitting all of m information packets, and a method for receiving a notification on packet numbers of those packets which did not arrive from the receiving side and re-transmitting only those packets having the notified packet numbers. However, as a method that can reduce an amount of transmission compared with any of these methods, the following method is also available.

(1) The same as above.

(2) At the receiving side, when y pieces of packets out of m+k packets do not arrive where y is greater than k, a re-transmission request is sent to the transmitting side by attaching a value of y−k.

(3) In response, the transmission side produces y−k pieces of re-transmission packets and send them to the receiving side.

When this method is adopted, the number of packets to be re-transmitted can be limited to just y−k pieces.

In the above described procedure, at the step (1), it is possible to use either the conventional coding scheme or the coding scheme of the first embodiment. In either case, the correction capability of the code words contained in the packet transmitted first is the same. Also, in the case of carrying out the transmission using the conventional coding scheme in (1) and then carrying out the transmission of the redundant packets produced according to the present invention as the re-transmission processing of (2) and (3) is required, it is possible for the receiving side to carry out the correction processing using the packets of the conventional code words and the additionally received redundant packets, although the calculation becomes somewhat complicated. Note however that, in the case of system in which the number k of the redundant packets varies in (1), it is preferable to use the coding scheme of the first embodiment even for the packet to be transmitted first. This is because the conventional scheme requires many circuits or program codes for generator polynomials at the transmitting side when k varies, as already mentioned above.

What is more problematic is the step (3). When the conventional coding scheme is used, from a standpoint of the transmitting side, it is necessary to carry out the division using a polynomial of (y−k)-th degree which is totally unrelated to G(X) of k-th degree that is used before. The value of y−k can be at most up to a smaller one of m−k and $2^h-1-m-k$, so that it is necessary to provide m−k types or $2^h-1-m-k$ types of different calculation circuits or programs. Usually, it is designed such that m−k is smaller than $2^h-1-m-k$. Thus the conventional scheme requires a considerably large circuit size. In contrast, when the coding scheme of the present invention is used, y−k types of re-transmission packets can be easily produced by the identical method. In the following, this aspect of the present invention will be described in further detail.

First, similarly as in the first embodiment, D as expressed by the equation (18) is transmitted from the transmitting side to the receiving side. D given by the equation (18) contains m information symbols I along with k redundant symbols in forms of T[i] (i=0 to k−1) as expressed by the equation (17).

The receiving side then receives D' with some symbol dropping. When the number of dropped symbols in D' is less than or equal to k, it is possible to recover them by applying the error correction scheme of the first embodiment directly, but when the number of dropped symbols in D' is y where m+k≧y>k, the receiving side requests a re-transmission of y−k symbols to the transmitting side.

Upon receiving this request, the transmitting side produces packets for re-transmission. In this case, because T[0] to T[k−1] have already been transmitted, the transmitting side syndrome values for the subsequent T[k] to T[y−1] are calculated, and only these transmitting side syndrome values are transmitted to the receiving side. Here, the transmitting side syndrome values are calculated by sequentially substituting k to y−1 into the place of i in the equation (17).

As for the value i of the above described T[i] to be transmitted/re-transmitted, the case of using values sequentially starting from 0 has been described above for the sake of simplicity, but in practice, there is no need to use any specific order for the symbols T[i] contained in the redundant packets to be transmitted. Namely, for the first k pieces, the values of i are arbitrary as long as they are different values on $CF(2^h)$. The same is also true for y−k pieces of T[i] to be transmitted at a time of re-transmission. Note however that the values of i to be used at a time of re-transmission must be also different from the values of i used for the k pieces transmitted first, for the following reason.

Namely, at the receiving side, it becomes possible to recover the original information by the error correction processing when a total of the number of received information symbols and the number of non-overlapping redundant symbols reaches to m. When y−k pieces of redundant symbols are required and if those redundant symbols which are apparently not transmitted before are transmitted, the recovery of the information becomes possible when all of these redundant symbols reach to the receiving side. However, if y−k pieces of redundant symbols including those transmitted before are transmitted, and the receiving side receives the same redundant symbols for a plurality of times, even when all of these y−k pieces of redundant symbols properly reach to the receiving side, it is impossible to carry out the correction because the number of symbols necessary for the correction will not be available. In order to prevent such a situation, the packets containing the redundant symbols different from those transmitted before are to be transmitted in the case of transmitting redundant packets as a re-transmission.

When y pieces of the redundant symbols reach to the receiving side in this manner, the receiving can recover the original information symbols by carrying out the error correction similarly as in the first embodiment.

As a variation to the above described procedure, it is also possible to use a procedure in which the necessary number y−k of re-transmission symbols as well as the identification numbers of the dropped syndrome values are indicated at a time of re-transmission request from the receiving side. In this case, the transmission side can carry out the re-transmission in such a manner than the sum of the syndrome values that reached the receiving side without being dropped and the newly produced syndrome values becomes y−k. In such a case, by storing the once transmitted syndrome value and utilizing that information actively at a time of re-transmission, it is possible to reduce the amount of calculations for re-transmission symbols that must be newly produced so that the procedure can be made more efficient.

Also, as another variation, it is also possible to use a procedure in which the number of re-transmission symbols are not notified from the receiving side. For example, it is possible to use the following procedure.

(1) The same as above.

(2) At the receiving side, when y pieces of packets out of m+k packets do not arrive where y is greater than k, only a NACK signal is returned to the transmitting side.

(3) In response, the transmission side produces a prescribed number (z pieces) of re-transmission packets and send them to the receiving side.

In this case, if $z \geq y-k$, it is possible for the receiving side carry out the correction processing by using these redundant packets. At this point, the unnecessary z(y−k) pieces of redundant packets can be discarded without utilizing them at the receiving side. On the other hand, if z<y−k, the receiving side returns a NACK signal to the transmitting side again, and the transmitting side transmits the further z pieces of re-transmission packets. As should be obvious, there are cases in which the z pieces of re-transmission packets are discarded, and in such a case, the above operation is to be repeated until the packets necessary in carrying out the correction at the receiving side become all available.

Now, the required circuit size in this second embodiment will be compared with the conventional case similarly as done in the first embodiment.

As shown in FIG. 12, when the conventional coding scheme is used, a division circuit of the degree k is needed initially, and then division circuits of degrees ranging from the degree 1 to the degree m−k are necessary for re-transmission, so that the required division circuit size is given by:

$$k+1+2+\ldots+(m-k)=k+(m-k)(m-k-1)/2 \quad (24)$$

by taking a circuit for a calculation of a particular degree as one unit.

On the other hand, as shown in FIG. 13, according to the coding scheme of this second embodiment, k pieces of division circuits of degree 1 are needed initially and then at most m−k pieces of division circuits of degree 1 are necessary, so that the total required circuit size can be only as much as m. The similar result can be also obtained in terms of the required amount of software programs in the case of realizing the above operation by software.

Thus, even in the case of combining the error correction and the re-transmission, by adopting the coding scheme which calculates the syndrome values only for the information symbol section at the transmitting side, it is possible to realize the communication system that requires a smaller circuit size or amount of software programs.

Figure 14:
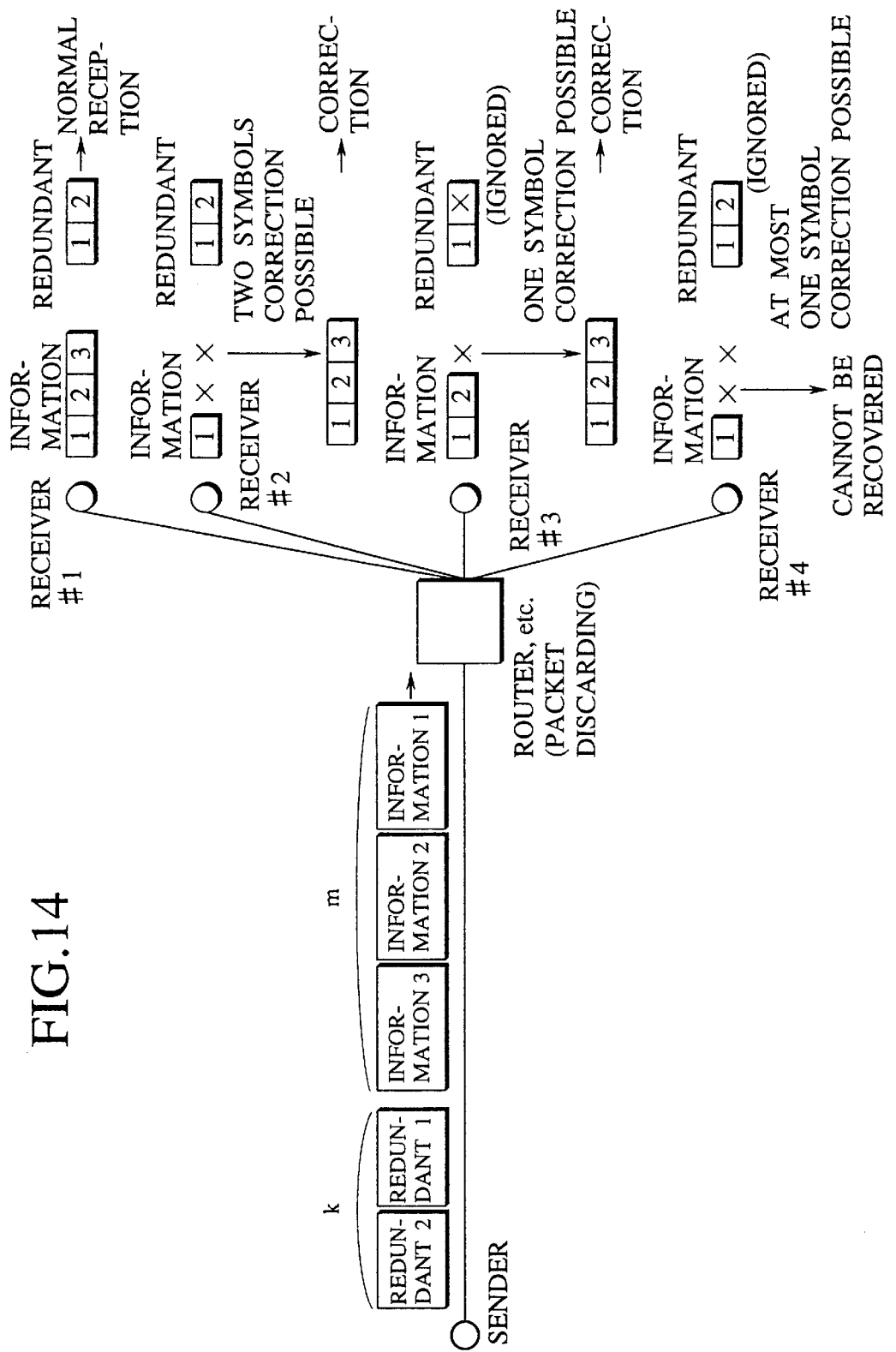
FIG. 14 is a diagram showing an error correction scheme in a multicast communication system according to the third embodiment of the present invention.

Referring now to FIG. 14, the third embodiment of a code transmission scheme according to the present invention will be described in detail.

This third embodiment is directed to a case of applying the scheme of the first embodiment to the multicast communication.

The multicast communication uses one transmission terminal and a plurality of reception terminals in general, and is designed such that, when the transmission terminal transmits data using a multicast address, the data are delivered to each reception terminal according to that multicast address at the network.

As a re-transmission control scheme in the transport layer for the purpose of securing the reliability, TCP (Transmission Control Protocol) is known, but this is a point-to-point protocol which cannot handle the multicast. Consequently, in the case of realizing the multicast communication, UDP (User Datagram Protocol) is usually used instead of TCP.

In order to realize the reliable communication in such a situation, it is possible to consider the use of a method in which the information packets and the redundant packets are transmitted as shown in FIG. 1 or FIG. 2 and the error correction is carried out at the receiving side. By using UDP at an upper level, it is possible to endow the reliability to the communication system which is originally operating in the best-effort basis.

FIG. 14 shows an outline of system operation in this third embodiment. The transmission terminal transmits m pieces of information packets by attaching k pieces of redundant packets, toward a plurality of reception terminals. At each reception terminal, the recovery using the error correcting codes can be made with respect to discarding of up to k packets among m+k packets. From a viewpoint of securing the reliability, it is preferable to set up k as large as possible, but from a viewpoint of the capability of the reception terminal, there is a limit to a value of k that can be set up, and this limit is different for different terminals as it depends on the processing power of the terminal. In the case of multicast, in order to deal with an increase in the number of multicasts, it is preferable to restrict communications in view of the convenience at the individual terminal as much as possible, so that it is preferable not to carry out any negotiation regarding an upper bound for the value of k at the start of communication session.

By applying the coding scheme of the first embodiment, it is possible to realize such a multicast communication without requiring this negotiation, as follows.

First, the transmission terminal sends m information packets containing m information symbols respectively and k redundant packets containing k redundant packets respectively as expressed by the equation (18), toward a plurality of reception terminals, similarly as in the examples described above. Each reception terminal has the predetermined maximum number w for redundant packets that can be processed, and when w≧k, the processing is carried out by taking all the redundant packets without any problem, but when w<k, only w pieces of redundant packets are taken in while the rest is discarded.

In the case of using the conventional coding scheme, it has been impossible to carry out the syndrome calculation for the purpose of the error correction at the receiving side unless all the packets that can be received are received once. However, in the case of using the coding scheme of this third embodiment, by acquiring the redundant packets up to a range that can be processed by the reception terminal besides the data packets, it is possible to correct the dropping for as many as the number of acquired redundant packets, regardless of the number of transmitted redundant packets.

FIG. 14 shows this situation for an exemplary case of m=3 and k=2 in a simplified form. The receiver #1 is receiving all the information packets without error which is the case of normal reception. The receiver #2 has two information packets lost but two redundant packets have arrived and this terminal has the capability to correct two symbols so that it can recover the original information packets. The receiver #3 has lost one information packet but two redundant packets have arrived. This receiver #3 has a capability for correcting at most one symbol so that one of the redundant packets is ignored and discarded. However, there is only one information packet dropping so that it is possible to recover the original information packet.

In contrast, the receiver #4 has lost two information packets. Two redundant packets have also arrived correctly but this terminal #4 has a capability for correcting at most one symbol so that one of the redundant packets is ignored and discarded. Consequently in this case it is impossible to recover the original information packets.

In this communication system, the delivery of the redundant packets incorporating the error correction function is used so that the multicast information that could have correctly received only by the receiver #1 otherwise can also be received by the receiver #2 and the receiver #3 as well, so as to improve the communication throughput. Here however there is a case like that of the receiver #4 which still cannot receive the multicast information. In other words, this system is not perfect but designed to be effective in improving the reliability of the multicast communication.

By using the scheme for calculating the transmitting side syndrome value of this third embodiment in the case of realizing the reliable multicast communication using the the error correction function, it is possible to realize the communication without requiring a complicated negotiation processing regarding the number of redundant packets, even under an environment that involves reception terminals with not very high processing power.

Note here that it suffices for the reception terminal to have a capability of carrying out the following operations:

It gives up the correction when packets in excess of the own correction capability are discarded.

It ignores the excessive redundant packets when more redundant packets than the necessary number arrive.

It executes the correction if necessary in any other cases.

Figure 15:
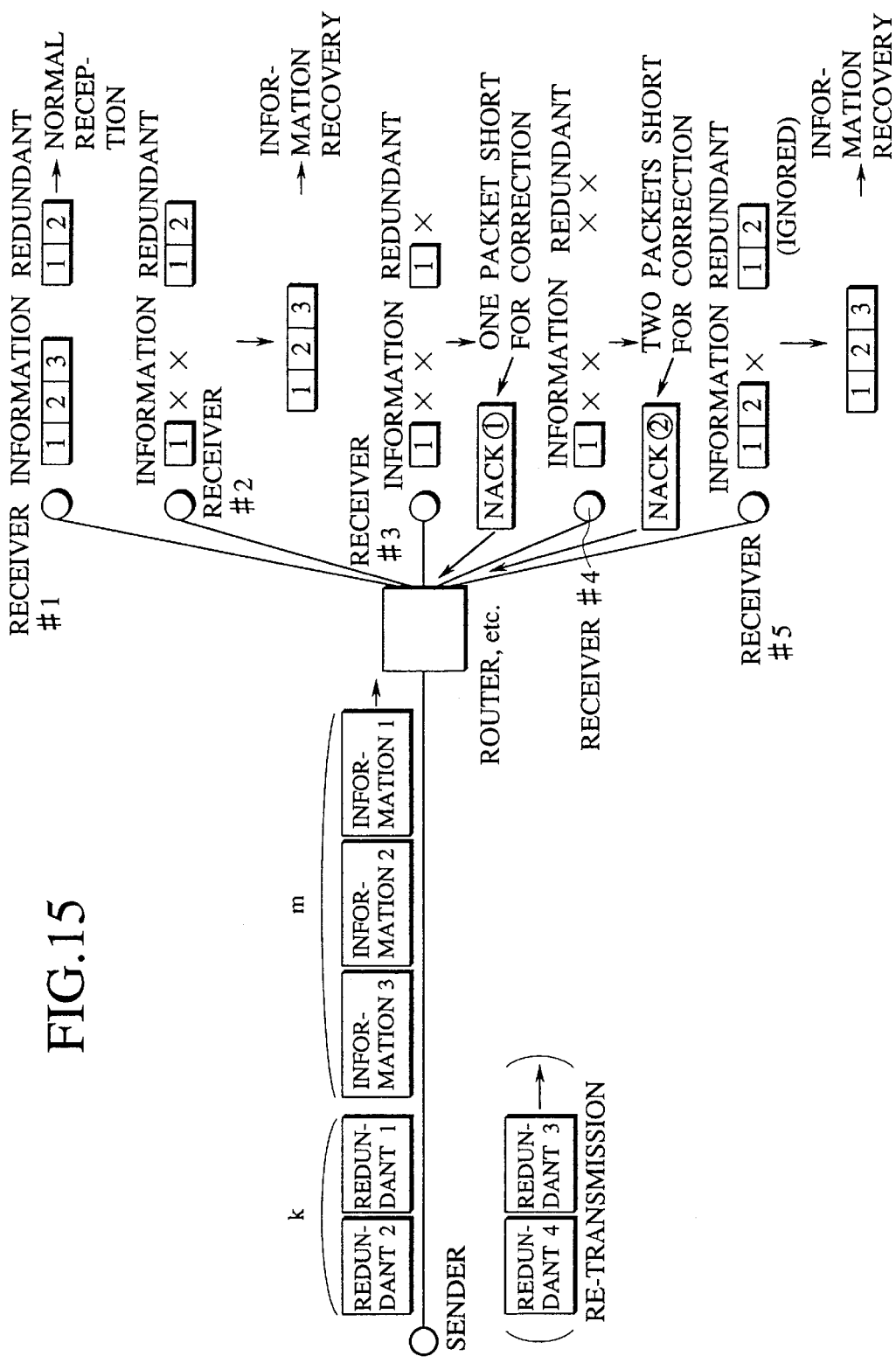
FIG. 15 is a diagram showing an error correction and re-transmission control scheme in a multicast communication system according to the fourth embodiment of the present invention.
Figure 16:
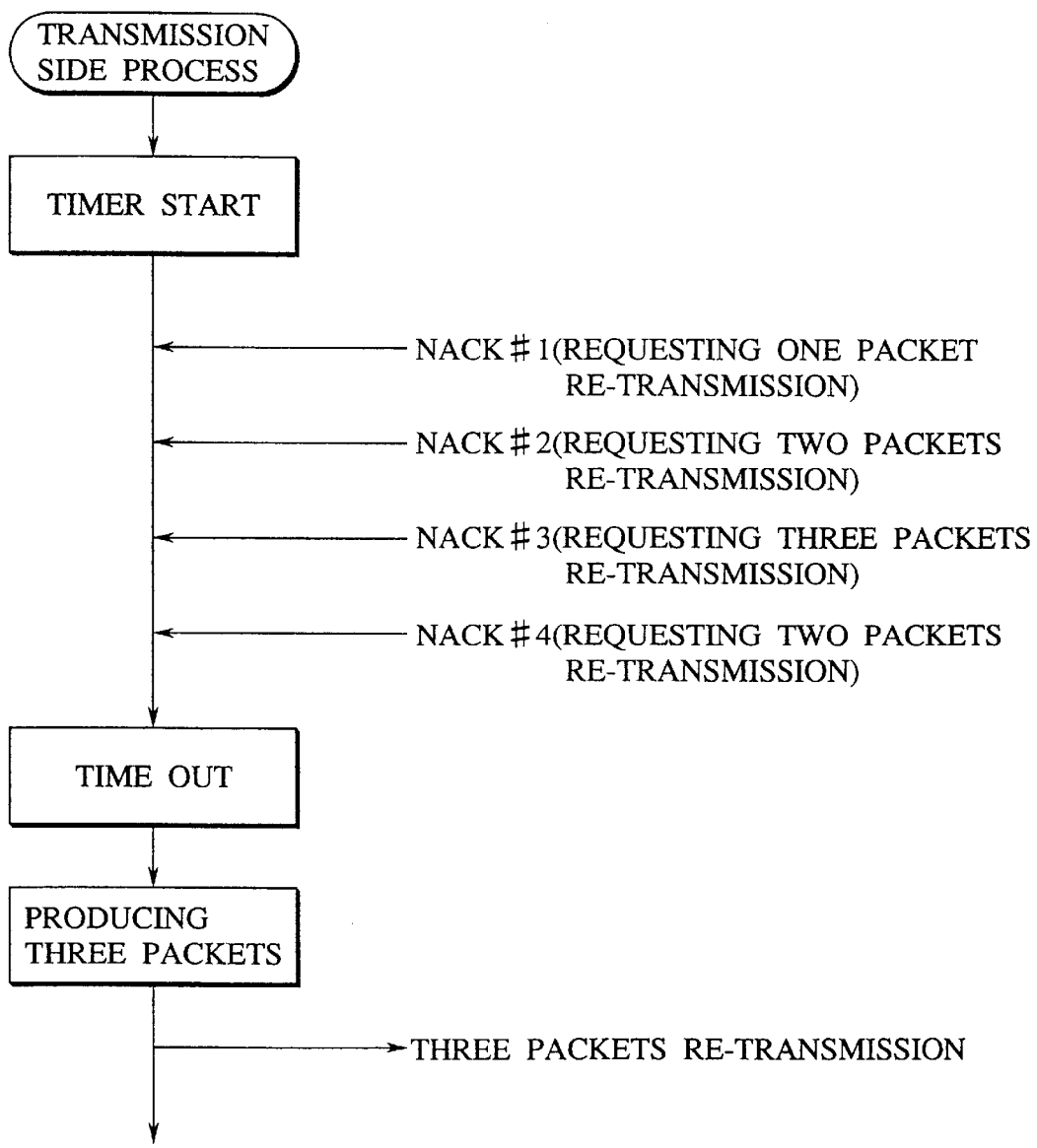
FIG. 16 is a sequence chart for a re-transmission processing according to a conventional scheme.
Figure 17:
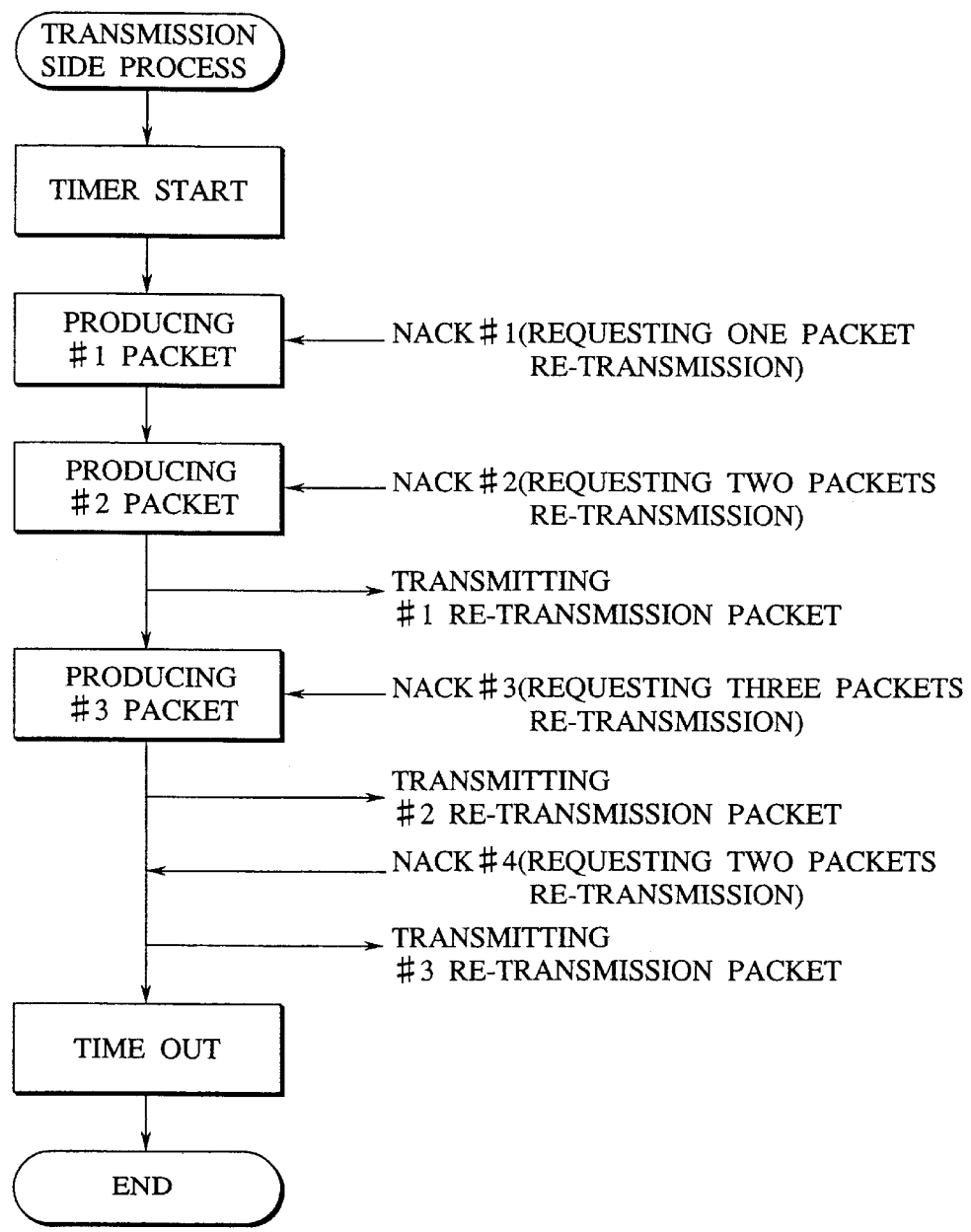
FIG. 17 is a sequence chart for a re-transmission processing according to the fourth embodiment of the present invention.

Referring now to FIG. 15 to FIG. 17, the fourth embodiment of a code transmission scheme according to the present invention will be described in detail. This fourth embodiment is directed to a case of realizing the multicast communication of a very high reliability, using reception terminals with relatively high processing power, unlike the third embodiment.

In order to secure the high reliability in the end-to-end communication, it is necessary not only to transmit the redundant packets having the error correction function in succession to the information packets but also to return a feedback as to whether packets have been received correctly or not from the reception terminal to the transmission terminal. More specifically, it is necessary to utilize functions called ACK and NACK.

In the case of the point-to-point communication, it suffices to simply carry out the re-transmission of packets according to such ACK/NACK, but in the case of the point-to-multipoint communication using a plurality of reception terminals, it is difficult for the transmission terminal to deal with ACK/NACK from a plurality of terminals in sophisticated manner because of the limited processing power.

For this reason, this problem is resolved in this fourth embodiment by applying the scheme used in the second embodiment, as follows.

(1) The transmission terminal sends m information packets containing m information symbols respectively and k redundant packets containing k redundant packets in forms of transmitting side syndrome values respectively as expressed by the equation (18), toward a plurality of reception terminals.

(2) At each reception terminal, when the number of lost packets is less than or equal to k among m+k packets, the original information packets are recovered by carrying out the error correction. Also, when the number of lost packets y is greater than k, a request for re-transmission of y–k packets is sent to the transmitting side along with a NACK signal.

(3) At the transmission terminal, NACK signals received from a plurality of terminals are checked and as many re-transmission packets as requested by the re-transmission request that is requesting the largest number of re-transmission packets are produced and re-transmitted.

Even in the case of the multicast, it is also possible to use the conventional coding scheme at the step (1), similarly as in the case of unicast described above. However, as already mentioned above, it is preferable to use the constant number k of the redundant packets in the case of transmitting packets by the conventional coding scheme first.

The procedure of this fourth embodiment is characterized in that the step (2) is NACK based. In the case of ACK based operation, there is a need for the transmission terminal to comprehend the number of reception terminals and the state of individual terminal, so that it is impossible to deal with an increase in the number of multicasts. In contrast, in the case of NACK based operation, it is possible to carry out the multicast communication without comprehending the state of individual terminal in detail.

Also, even in the case of NACK based operation, if it is required to specify the information packets to be re-transmitted, there is a need to check and store the packets to be transmitted for each NACK signal, so that the processing load on the transmission terminal can be quite large. In this regard, according to the scheme of this fourth embodiment, it is only required to find the largest number of requested re-transmission packets among the NACK signals which can be realized easily, and in particular the production of the re-transmission packets can be started as soon as the first NACK signal arrives, so that it is possible to realize the efficient re-transmission control.

FIG. 15 shows this situation for an exemplary case of m=3 and k=2 for the sake of simplicity. The sender multicasts m+k packets first. The receiver #1 is receiving all the information packets without error which is the case of normal reception. The receiver #2 has two information packets lost but two redundant packets have arrived and so that the original information packets can be recovered from them. These receivers are obtaining the information correctly so that they make no action with respect to the transmitting side.

On the other hand, the receiver #3 received only two packets (one information packet and one redundant packet) for the information of three packets and one more packet is necessary for the purpose of recovery, so that it returns a NACK signal ① to the sender by attaching a re-transmission request for one packet. Also, the receiver #4 received only one packet (one information packet) for the information of three packets and two more packets are necessary for the purpose of recovery, so that it returns a NACK signal ② to the sender by attaching a re-transmission request for two packets. Upon receiving these NACK signals, the sender newly produces the redundant packets as many as the largest number of re-transmission packets requested (two packets in this example) and re-transmits them as the re-transmission packets.

Also, the receiver #5 received two information packets so that it is possible to start the recovery processing as soon as one redundant packet arrives after that. The second redundant packet that arrives after that can be ignored and discarded. Thus, according to the scheme of this fourth embodiment, it is possible to start the recovery processing as soon as packets necessary for the recovery become available at the receiving side so that it is possible to realize the highly efficient processing.

In contrast, in the case of using the conventional scheme, when there is a lost information packet, it is customary to start the syndrome calculation for the purpose of correction only after all the redundant packets are received once. For this reason, it has been necessary to delay the start of the processing until all the redundant packets arrive, so that the efficiency has been poor. Moreover, when the last redundant packet has a large delay, its influence has been even larger.

Furthermore, there is a difference in the processing efficiency at the transmitting side as well. As already described above, when the conventional coding scheme is used in such a system, apart from the obvious increase of the circuit size, it has been necessary for the transmitting side to wait for the arrival of all of a plurality of NACK signals that can be expected to arrive because a circuit to be utilized is different depending on the number of re-transmission packets to be produced. In addition, the re-transmission packet production processing cannot be started until the largest number of re-transmission packets is determined. FIG. 16 shows this situation.

The sender awaits for the arrival of the NACK signal from the receiving side using the timer management for example. Now, suppose that NACK#1 to NACK#4 are to arrive, and re-transmission requests for one to three packets are to be made by them. In the transmitting side process, whenever one NACK signal arrives, the largest number of re-transmission packets requested among the already arrived NACK signals is stored. Then, only after the timer becomes time out, the three redundant packets are produced and re-transmitted.

On the other hand, in the case of using the scheme of this fourth embodiment, the redundant packet production circuit is different for each redundant packet, so that as soon as the NACK signal arrives the redundant packet production process for the purpose of re-transmission can be started out accordingly. FIG. 17 shows an exemplary case of this situation.

In FIG. 17, the NACK#1 signal arrives first and it makes a re-transmission request for one packet, the production of one re-transmission packet (#1 packet) is started at this point. Next, when the NACK#2 signal arrives and it makes a re-transmission request for two packets, since the production of one packet has already started, the number of packets to be produced is increased by just one and the production of the #2 packet is started at this point. Then, when the NACK#3 signal arrives and it makes a re-transmission request for three packets, since the production of two packets has already started, the production of one more packet (#3 packet) is newly started at this point. After that, the NACK#4 signal arrives and it makes a re-transmission request for two packets, but three packets has already been produced so that this request is ignored.

Between arrivals of these NACK signals, each re-transmission packet is transmitted when its production is completed. When the timer becomes time out, the entire processing is effectively finished so that the processing time can be shortened and the efficiency can be improved compared with the conventional case.

In this manner, by utilizing the coding scheme based on the transmitting side syndrome value of this fourth embodiment in realizing the reliable multicast communication, it becomes possible to deal with the multicast scale increase easily, while realizing the high efficiency of the processing and the reduction of the circuit size or the amount of software programs.

Figure 18:
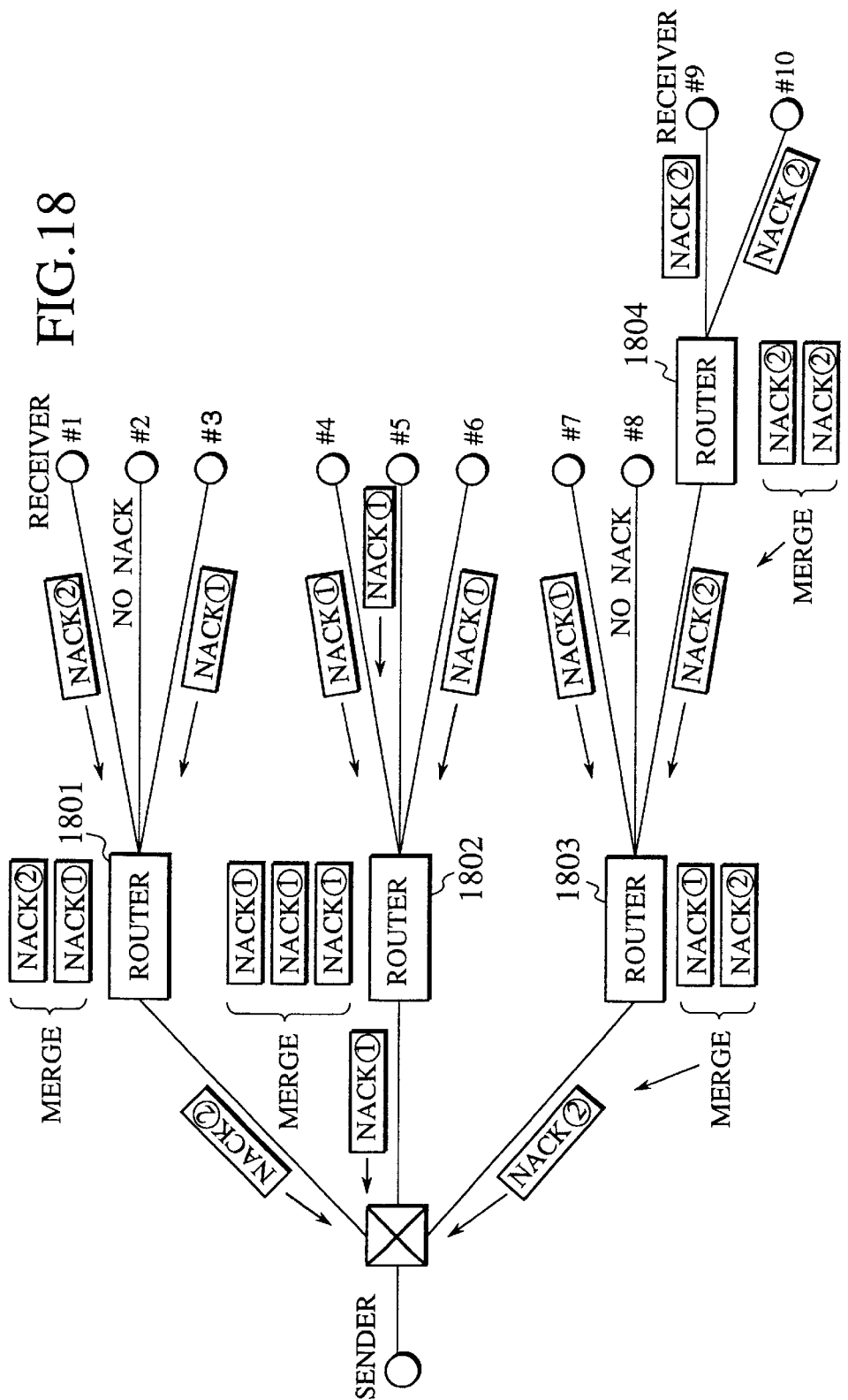
FIG. 18 is a diagram showing a case where routers have a function for merging a plurality of NACK signals in the fourth embodiment of the present invention.

In particular, in the case of carrying out the large scale multicast involving hundreds or thousands of receivers, there can be cases in which the NACK signals are to be merged at the relaying routers, etc., as shown in FIG. 18. In such a case, when the coding scheme of the present invention is used, the merging can be made by taking the largest value for the re-transmission request among the NACK signals from a plurality of downstream sides, so that it becomes possible to realize the far more efficient transmission compared with the case of requesting the packet numbers to be re-transmitted individually.

For example, in FIG. 18, there are ten reception terminals with respect to one transmission terminal, and the NACK signals are sent from eight reception terminals among these ten reception terminals. If these NACK signals are sent to the sender as they are, the sender must process eight NACK signals. However, the router 1801 merges the NACk signal ① and the signal ② and sends only one NACK signal ② to the sender, while the router 1802 merges three NACK signals ① and sends only one NACK signal ① to the sender. Also, the router 1804 merges two NACK signals ② to the intermediate router 1803, and the router 1803 merges the NACK signal ② from the router 1804 and the NACK signal ① and sends only one NACK signal ② to the sender.

Here, the method for merging the NACK signals is a simple one in which the NACK signal with the largest re-transmission request packet number described therein is selected from a plurality of NACK signals. By using such a scheme for utilizing intermediate routers to carry out the NACK signal processing only three NACK signals reach to the sender in FIG. 18, so that it is possible to reduce the processing load of the sender.

Here, as a variation, a model in which a specific group of receivers have different characteristics among the multicast group will be considered. For instance, it can be the case where a link is very thin at some location alone so that it is hard to pass packets therethrough, or the case where there is a relay router at which the congestion is very easily caused so that the packet loss rate characteristic is particularly poor there, or else the case where some link is a radio link so that the packet discarding at a relay node due to the bit error occurs. On the contrary, it can be the case where packets destined to some reception terminal are transmitted through a dedicated line so that they are hardly dropped and a particularly good characteristic is realized for that reception terminal.

In such a case where the groups of receivers having apparently different packet loss characteristics are involved in the multicast, even when they are the same multicast group, there are cases in which the re-transmission processing is separately carried out in units of reception terminals or groups of terminals. Namely, m pieces of information packets and the k pieces of redundant packets are transmitted with respect to the multicast group first similarly as in the above, and then the smaller multicast units are formed by the terminals having the similar packet loss characteristics and the re-transmission processing is carried out in these smaller multicast units.

In principle, it is important to be capable of carrying out the multicast regardless of the number of receiving sides, but in the case where there is a need to carry out many re-transmissions with respect to some specific group of receives alone, it is not very preferable to transmit these re-transmission packets to all the receivers from a viewpoint of the network utilization efficiency. Consequently, the number of re-transmission packets should be assigned separately to each receiver group.

Figure 19:
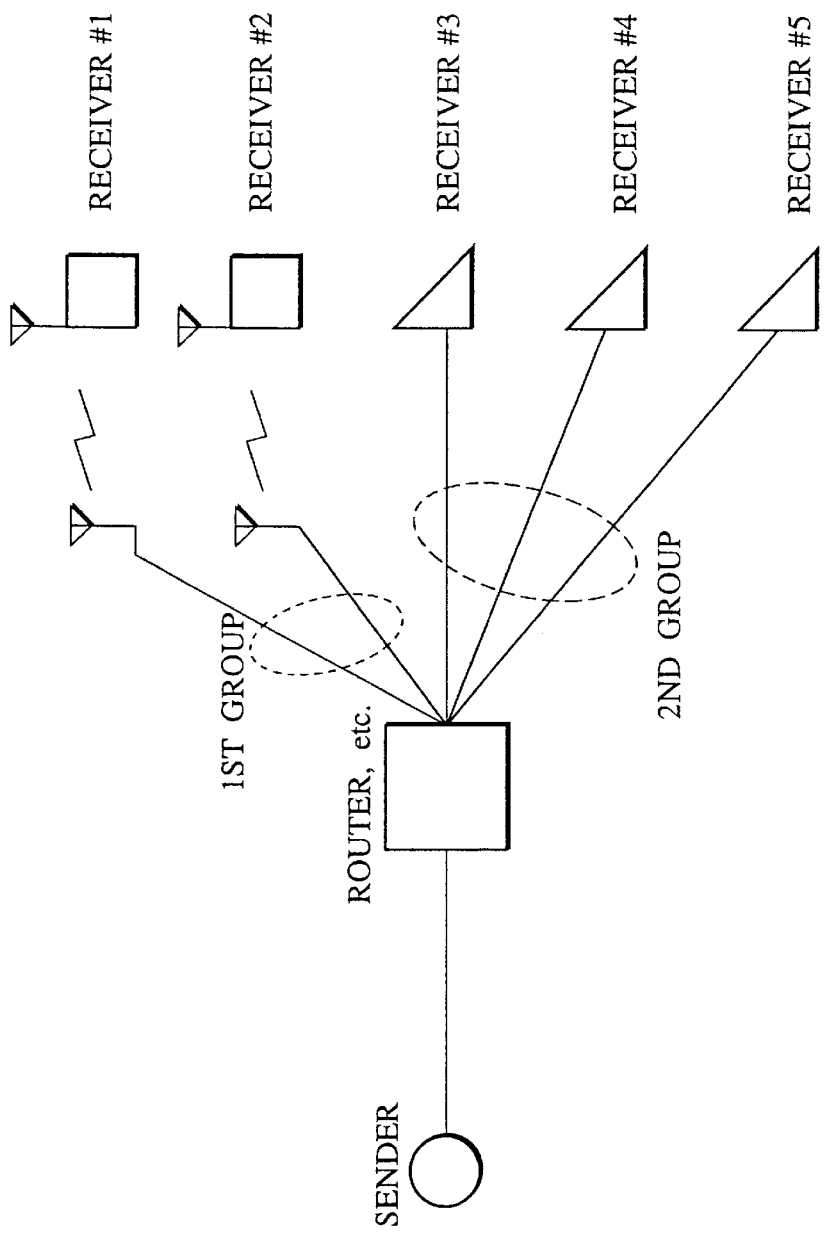
FIG. 19 is a diagram showing a case of carrying out re-transmission processing in group units in the fourth embodiment of the present invention.

A simple example is shown in FIG. 19, where the sender carries out the multicast with respect to five receivers. The receivers #1 and #2 are radio terminals, for which the packet loss rate is high. On the other hand, the receivers #3, #4 and #5 are the wire terminals for which the packet loss hardly occurs. In this case, the sender classifies the receivers #1 and #2 as the first group and the receivers #3, #4 and #5 as the second group, in advance. Also, the NACK signals from these receivers are made such that it is possible to recognize a group from which each NACK signal originates.

Now, suppose m=5 and k=2 so that seven packets are transmitted. The first transmission is similarly transmitted to all five receivers. Then, suppose that the NACK signal ③ from the receiver #1, the NACK signal ④ from the receiver #2, and the NACK signal ① are returned to the sender while no NACK signals are returned from the receivers #3 and #4. In this case, the sender looks at the NACK signals from the receivers of the first group first and newly produces four packets in correspondence to the largest value of their requested packet numbers, and transmits them by setting only the first group as destination. On the other hand, the sender looks at the NACK signal from the receivers of the second group and notices the the requested packet number is just one, so that the sender selects one packet arbitrarily from the four redundant packets transmitted to the first group earlier, and transmits it only to the second group.

When the groups are formed in this manner, the number of redundant packets that have to be produced is four just as in the case of using no groups, and the number of NACK signals to be merged is three also just as in the case of using no groups. The processing differs only in that the NACK signal merging processing is divided into two parts, and a plurality of transmission target groups are used at a time of re-transmission. Consequently, even when the re-transmission packet processing with respect to a plurality of groups is carried out in this manner, the processing load on the sender is not much different when the coding scheme of the present invention is used.

If the conventional coding scheme is used in transmitting the redundant packets at a time of re-transmission, it is necessary to produce the packets separately in forms of four redundant packets that can be produced by using the generator polynomial of degree four and one redundant packet that can be produced by using the generator polynomial of degree one, so that the processing load of the sender is going to be increased.

As described, when the coding scheme of the present invention is used in the case of realizing the reliable multicast, it suffices to carry out the processing equivalent to the case of using no groups even when the separate re-transmission processing with respect to a plurality of groups is to be carried out, and therefore it is possible to realize the reliable multicast without increasing the processing load of the sender.

As described, according to the present invention, the packet communications are carried out by applying the scheme using the transmitting side syndrome values as the redundant symbols, so that it is possible to realize the reduction of the circuit size and the larger flexibility compared with the case of using the conventional coding scheme.

More specifically, in the first place, by calculating the syndrome value only for the same information section at the transmitting side and the receiving side and carrying out the error correction using this syndrome value, it becomes possible to reduce the circuit size or the amount of software programs compared with the case of using the conventional coding scheme.

In particular, the correction power becomes maximum when the method used in decoding the Reed-Solomon codes is utilized as a method for calculating the syndrome value.

Secondly, even in the communication scheme which combined the error correction function with the re-transmission control, by applying the coding scheme in which the syndrome value is calculated only for the information section at the transmitting side, it becomes possible to reduce the circuit size or the amount of software programs required for the processing compared with the case of using the conventional coding scheme.

Thirdly, in the case of realizing the reliable multicast communication using the error correction function, by utilizing the coding scheme for calculating the transmitting side syndrome value, it becomes possible to realize the communication without requiring a complicated negotiation processing regarding the number of redundant packets, even under an environment that involves reception terminals with not very high processing power.

Fourthly, in the case of realizing the reliable multicast communication by combining the error correction function and the re-transmission control, by utilizing the coding scheme for calculating the transmitting side syndrome value, it becomes possible to deal with the further multicast scale increase, while realizing the high efficiency of the processing and the reduction of the circuit size or the amount of software programs.

It is to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method for transmitting an error correcting code corresponding to an information to be transmitted in a communication system, comprising the steps of:

generating as many transmitting side syndrome values as a number corresponding to a desired error correction capability using said number of mutually different polynomials of degree one, by carrying out a syndrome calculation for the information to be transmitted at a transmitting side, such that the desired error correction capability is increased by increasing said number of mutually different polynomials of degree one; and transmitting, from the transmitting side to a receiving side, at least one information packet containing the information to be transmitted and at least one redundant packet containing the transmitting side syndrome values generated by the generating step as a redundant part of the error correcting code.

2. The method of claim 1, wherein the transmitting step enters a plurality of information symbols obtained by dividing the information to be transmitted into a plurality of information packets distributedly.

3. The method of claim 1, wherein the transmitting step enters a plurality of transmitting side syndrome values generated with respect to the information to be transmitted into a plurality of redundant packets distributedly.

4. The method of claim 1, wherein the generating step generates the transmitting side syndrome value by using the syndrome calculation based on a calculation method used for decoding Reed-Solomon codes.

5. The method of claim 1, wherein the generating step generates a plurality of transmitting side syndrome values based on mutually different powers of a root of a primitive polynomial used in defining a code word for the information.

6. The method of claim 1, further comprising the steps of:

receiving at least a part of the information packet and the redundant packet transmitted by the transmitting step at the receiving side;

obtaining at least one receiving side syndrome value by carrying out a syndrome calculation for an information contained in the information packet as received by the receiving step at the receiving side; and performing error correcting, if required, by calculating a difference between the transmitting side syndrome value contained in the redundant packet as received by the receiving step and the receiving side syndrome value obtained by the obtaining step.

7. The method of claim 6, wherein the obtaining step obtains the receiving side syndrome value by using the syndrome calculation based on a calculation method used for decoding Reed-Solomon codes.

8. The method of claim 6, wherein the obtaining step obtains a plurality of receiving side syndrome values based on mutually different powers of a root of a primitive polynomial used in defining a code word for the information.

9. The method of claim 1, further comprising the step of:

transmitting another redundant packet containing another transmitting side syndrome value, as retransmission from the transmitting side to the receiving side, when the receiving side cannot recover the information from the information packet and the redundant packet received by the receiving step.

10. The method of claim 9, further comprising the steps of:

receiving said another redundant packet transmitted by the re-transmitting step, as many as the receiving side should process; and carrying out a recovery of the information by carrying out a syndrome calculation using said another redundant packet as received by the receiving step at the receiving side.

11. The method of claim 9, wherein the re-transmitting step re-transmits said another redundant packet by multicast with respect to a plurality of receiving sides.

12. The method of claim 1, wherein the transmitting step transmits the information packet and the redundant packet by multicast with respect to a plurality of receiving sides.

13. The method of claim 12, further comprising the steps of:

receiving the redundant packet transmitted by the transmitting step, as many as the receiving side should process; and carrying out a recovery of the information by carrying out a syndrome calculation using the redundant packet as received by the receiving step at the receiving side.

14. The method of claim 1, wherein the information to be transmitted is an IP packet and the method further comprises the step of dividing the IP packet into m pieces of divided data, where m is an integer greater than one;

the generating step further divides each divided data into n pieces of information symbols, where n is an integer greater than one, and carries out a processing for generating said at least one transmitting side syndrome value for a set of m pieces of information symbols each selected from different one of the m pieces of divided data, with respect to each one of n sets of information symbols; and the transmitting step enters the m pieces of divided data into payload sections of m pieces of information packets respectively, and enters n pieces of admitting side syndrome values generated by the generating step into redundant packets.

15. The method of claim 14, wherein the transmitting step transmits each one of the information packet and the redundant packet in a form of an IP-FEC packet.

16. The method of claim 14, wherein the dividing step divides the IP packet by using an interleave matrix.

17. A method for transmitting an error correcting code corresponding to an information to be transmitted in a communication system, comprising the steps of:

transmitting, from a transmitting side to a receiving side, packets generated by applying an error correction coding processing with respect to the information to be transmitted at the transmitting side; and generating as many transmitting side syndrome values as a number corresponding to a desired error correction capability using said number of mutually different polynomials of degree one, by carrying out a syndrome calculation for the information to be transmitted at the transmitting side, such that the desired error correction capability is increased by increasing said number of mutually different polynomials of degree one, and transmitting, from the transmitting side to the receiving side, at least one redundant packet containing the transmitting side syndrome values as a redundant part of the error correcting code, when the receiving side cannot recover the information to be transmitted from the packets received from the transmitting side and requests a retransmission.

18. A transmission device for transmitting an error correcting code corresponding to an information to be transmitted in a communication system, comprising:

a generation unit configured to generate as many transmitting side syndrome values as a number corresponding to a desired error correction capability using said number of mutually different polynomials of degree one, by carrying out a syndrome calculation for the information to be transmitted at a transmitting side, such that the desired error correction capability is increased by increasing said number of mutually different polynomials of degree one; and a transmission unit configured to transmit, from the transmitting side to a receiving side, at least one information packet containing the information to be transmitted and at least one redundant packet containing the transmitting side syndrome values generated by the generation unit as a redundant part of the error correcting code.

19. A reception device for receiving an error correcting code corresponding to an information to be transmitted in a communication system, comprising:

a reception unit configured to receive at least a part of at least one information packet containing the information to be transmitted and at least one redundant packet containing as many transmitting side syndrome values as a number corresponding to a desired error correction capability using said number of mutually different polynomials of degree one for the information to be transmitted as calculated by a transmitting, side, such that the desired error correction capability is increased by increasing said number of mutually different polynomials of degree one;

a calculation unit configured to obtain at least one receiving side syndrome value by carrying out a syndrome calculation for an information contained in the information packet as received by the reception unit; and a correction unit configured to perform error correction, if required, by calculating a difference between each transmitting side syndrome value contained in the redundant packet as received by the reception unit and each receiving side syndrome value obtained by the calculation unit.

20. A communication system for transmitting an error correcting code corresponding to an information to be transmitted, comprising:

a generation unit configured to generate as many transmitting side syndrome values as a number corresponding to a desired error correction capability using said number of mutually different polynomials of degree one, by carrying out a syndrome calculation for the information to be transmitted at a transmitting side, such that the desired error correction capability is increased by increasing said number of mutually different polynomials of degree one;

a transmission unit configured to transmit, from the transmitting side to a receiving side, at least one information packet containing the information to be transmitted and at least one redundant packet containing the transmitting side syndrome values generated by the generation unit as a redundant part of the error correcting code;

a reception unit configured to receive at least a part of the information packet and the redundant packet transmitted by the transmission unit;

a calculation unit configured to obtain at least one receiving side syndrome value by carrying out a syndrome calculation for an information contained in the information packet as received by the reception unit; and a correction unit configured to perform error correction, if required, by calculating a difference between each transmitting side syndrome value contained in the redundant packet as received by the reception unit and each receiving side syndrome value obtained by the calculation unit.

* * * * *